United States Patent [19]
Kondo et al.

[11] Patent Number: 5,409,798
[45] Date of Patent: Apr. 25, 1995

[54] PLATE BLANK, PROCESS FOR PRODUCING PRINTING PLATE FROM PLATE BLANK, AND PRINTING METHOD AND APPARATUS USING PLATE

[75] Inventors: Yuji Kondo; Tsuyoshi Shibata, both of Yokohama, Japan

[73] Assignee: Canon Kabushiki Kaisha, Tokyo, Japan

[21] Appl. No.: 936,225

[22] Filed: Aug. 27, 1992

[30] Foreign Application Priority Data

Aug. 30, 1991 [JP] Japan .................. 3-220009

[51] Int. Cl.$^6$ ............................................. G03C 5/54
[52] U.S. Cl. ................................. 430/203; 430/253; 430/254; 430/255; 430/271; 430/273
[58] Field of Search ............... 430/253, 254, 255, 203, 430/271, 273

[56] References Cited

U.S. PATENT DOCUMENTS

| | | | |
|---|---|---|---|
| 3,589,903 | 6/1971 | Birkeland | 96/67 |
| 3,615,435 | 10/1971 | Chu et al. | 430/253 |
| 3,615,533 | 10/1971 | Rauner | 96/67 |
| 3,672,904 | 6/1972 | de Mauriac | 96/114.1 |
| 3,679,426 | 7/1972 | Youngquist | 96/114.1 |
| 3,751,252 | 8/1973 | Smith et al. | 96/63 |
| 3,751,255 | 8/1973 | Wilson et al. | 96/66 R |
| 3,756,829 | 9/1973 | Ohkubo et al. | 96/114.1 |
| 3,770,438 | 11/1973 | Celeste | 430/253 |
| 3,770,448 | 11/1973 | Poot et al. | 96/114.1 |
| 3,773,512 | 11/1973 | Poot et al. | 96/114.1 |
| 3,782,949 | 1/1974 | Olivares et al. | 96/76 R |
| 3,794,488 | 2/1974 | Henn et al. | 96/50 R |
| 3,801,321 | 4/1974 | Evans et al. | 96/48 HD |
| 3,819,382 | 6/1974 | Konig et al. | 96/114.1 |
| 3,827,889 | 8/1974 | Ohkubo et al. | 96/114.1 |
| 3,839,048 | 10/1974 | Poot et al. | 96/114.1 |
| 3,887,376 | 6/1975 | Wilson et al. | 96/66 R |
| 3,887,378 | 6/1975 | Klein et al. | 96/114.1 |
| 3,893,863 | 7/1975 | Wilson et al. | 96/95 |
| 3,928,686 | 12/1975 | Pott et al. | 428/457 |
| 4,050,936 | 9/1977 | Takeda et al. | 430/253 |
| 4,123,274 | 10/1978 | Knight et al. | 96/66 |
| 4,220,709 | 9/1980 | deMauriac | 430/353 |
| 4,289,841 | 9/1981 | Cohen et al. | 430/253 |
| 4,458,003 | 7/1984 | Shephard et al. | 430/253 |
| 5,001,032 | 3/1991 | Katayama et al. | 430/203 |
| 5,021,321 | 6/1991 | Fukui et al. | 430/203 |
| 5,171,657 | 12/1992 | Kagami et al. | 430/203 |

FOREIGN PATENT DOCUMENTS

| | | |
|---|---|---|
| 786086 | 11/1972 | Belgium . |
| 413863 | 2/1991 | European Pat. Off. . |
| 487260 | 5/1992 | European Pat. Off. . |

(List continued on next page.)

OTHER PUBLICATIONS

Patent Abstracts of Japan, vol. 10, No. 19 (P-423) (2076), Jan. 24, 1986.
Patent Abstracts of Japan, vol. 8, No. 55, (P-260) (1492) Mar. 13, 1984.

*Primary Examiner*—Richard L. Schilling
*Attorney, Agent, or Firm*—Fitzpatrick, Cella, Harper & Scinto

[57] ABSTRACT

A printing plate blank is formed by disposing successively a base layer, a photosensitive layer susceptible of peeling development, and a peeling support layer (or a laminate of a photosensitive silver salt layer including a photosensitive silver halide, an organic silver salt and a reducing agent). A printing plate is prepared by forming a polymerized part in the photosensitive layer through imagewise exposure and peeling apart the peeling support layer (or the laminate) together with the yet-unpolymerized port of the photosensitive layer to leave the polymerized part of the photosensitive layer on the base layer. The resultant printing plate is provided with an improved printing durability primarily by inclusion of a polymerizable compound in the base layer effective for firmly fastening the polymerized part to the base layer and additionally by subjecting the thus-prepared printing plate to additional exposure, heating and/or pressure application.

34 Claims, 4 Drawing Sheets

FOREIGN PATENT DOCUMENTS

| | | |
|---|---|---|
| 38-9663 | 6/1963 | Japan . |
| 44-18416 | 8/1967 | Japan . |
| 43-22901 | 10/1968 | Japan . |
| 45-30271 | 10/1970 | Japan . |
| 47-7728 | 4/1972 | Japan . |
| 48-43126 | 12/1973 | Japan . |
| 50-16023 | 2/1975 | Japan . |
| 50-36110 | 4/1975 | Japan . |
| 50-36143 | 4/1975 | Japan . |
| 50-99719 | 8/1975 | Japan . |
| 50-140113 | 11/1975 | Japan . |
| 50-147711 | 11/1975 | Japan . |
| 51-22431 | 2/1976 | Japan . |
| 51-23721 | 2/1976 | Japan . |
| 51-32324 | 3/1976 | Japan . |
| 51-51933 | 5/1976 | Japan . |
| 51-35851 | 10/1976 | Japan . |
| 52-84727 | 7/1977 | Japan . |
| 55-50246 | 4/1980 | Japan . |
| 57-58141 | 4/1982 | Japan . |
| 57-62046 | 4/1982 | Japan . |
| 58-118638 | 7/1983 | Japan . |
| 58-118639 | 7/1983 | Japan . |
| 63-250174 | 10/1988 | Japan . |
| 64-10055 | 2/1989 | Japan . |
| 64-10056 | 2/1989 | Japan . |
| 1-238935 | 9/1989 | Japan . |
| 1-45899 | 10/1989 | Japan . |
| 1-267093 | 10/1989 | Japan . |
| 1-269593 | 10/1989 | Japan . |
| 1-306855 | 12/1989 | Japan . |
| 1-306856 | 12/1989 | Japan . |
| 2-00072 | 1/1990 | Japan . |
| 2-80472 | 3/1990 | Japan . |
| 2-15383 | 4/1990 | Japan . |
| 2-105873 | 4/1990 | Japan . |
| 2-107678 | 4/1990 | Japan . |
| 2-110119 | 4/1990 | Japan . |
| 2020839 | 11/1979 | United Kingdom . |

PLATE BLANK, PROCESS FOR PRODUCING PRINTING PLATE FROM PLATE BLANK, AND PRINTING METHOD AND APPARATUS USING PLATE

FIELD OF THE INVENTION AND RELATED ART

The present invention relates to a printing plate blank and a process for producing a printing plate from the plate blank. More particularly, the present invention relates to a plate blank capable of providing a plate having an excellent printing durability suited for light or small-volume printing, particularly office printing, a process for producing a printing plate from the plate blank, and a printing method and a printing apparatus using the plate.

In the conventional lithographic method utilizing the immiscibility of water and oil, a hydrophilic non-image part and a lipophilic image part are generally formed on a lithographic plate. At the time of printing, dampening water is applied and held at the non-image part so as to enhance the ink repulsion at the non-image part and, in this state, an oily ink is applied to the plate to be repelled by the dampening water at the non-image part and selectively attached to the image part. The resultant ink image on the lithographic plate is then transferred to paper, etc., directly or indirectly through a blanket cylinder.

Among the lithographic plates used in the lithographic printing process described above, PS plates have been used for large volume printing. A PS plate is generally prepared by imparting the surface of a support plate of a metal, such as aluminum or metal, with hydrophilicity by abrasion or anodic oxidation, and applying thereon a photosensitive resin, followed by imagewise exposure and development to form a lipophilic resinous image part and a hydrophilic non-image part where the photosensitive resin has been removed.

For small-volume printing for office use, there has been used a plate which is prepared by forming a hydrophilic resin layer giving a non-image part on a water-resistant support and forming thereon a resinous toner image, e.g., by electrophotography, drawing an image with a ballpoint pen or an oily ink, or forming a printed image by a typewriter or a thermal head.

Among the above, however, the plates, such as PS plates and those obtained through wet-type electrophotography, involve problems concerning troublesome management and maintenance of liquids and disposal of waste liquids, and further environmental pollution with solvents.

On the other hand, among the plates for office use, some can be produced through a dry process, including those obtained by dry-type electrophotography, and those obtained by forming printed images by a typewriter or a thermal head. These are not necessarily satisfactory because of a low resolution and insufficient image quality and sharpness of the resultant images.

Further, the plates generally used for office use formed by wet-type or dry-type electrophotography, are inevitably accompanied by toner scattering, which leads to ground staining in the resultant printed products.

In order to provide a printing plate capable of solving the above problems, there has been proposed a type of printing plate prepared through dry-process development including a so-called peeling-apart treatment, wherein a plate blank is formed by coating a substrate successively with a photosensitive layer susceptible of peeling development and an upper layer of polyester, etc., and a difference in tackiness caused by photoirradiation is utilized for peeling development, as described in, e.g., Japanese Patent Publication (JP-B) 38-9663, JP-B 43-22901, Japanese Laid-Open Patent Application (JP-A) 47-7728, JP-B 48-43126, JP-A 55-50246, JP-A 57-58141, JP-A 57-62046, JP-B 64-10055, JP-B 64-10056 and JP-B 1-45899.

However, this type of printing plate has a difficulty, i.e., an inferior printing durability, because of a weaker adhesion between the hydrophilic support and a lipophilic polymerization image part, when compared with a PS plate. Particularly, in case where the hydrophilic layer is formed by paper or a hydrophilic resin, the adhesion between the support and the image part becomes weaker, and the decrease in adhesion is promoted when supplied with dampening water during printing, thus resulting in a very poor printing durability.

SUMMARY OF THE INVENTION

An object of the present invention is to provide a solution to the above-mentioned various problems.

A more specific object of the present invention is to provide a plate blank, from which a lithographic plate with excellent printing durability, resolution and edge sharpness can be produced through a convenient and quick dry process.

A further object of the present invention is to provide a process for producing a printing plate from the plate blank, and a printing method and a printing apparatus using the printing plate.

According to the present invention, there is provided a printing plate blank, comprising: a base layer, a photosensitive layer susceptible of peeling development, and a peeling support layer; wherein the base layer comprises a polymerizable compound.

According to the present invention, there is also provided a process for producing a printing plate, comprising:
- an imagewise exposure step of subjecting the above-mentioned plate blank to imagewise exposure to form a polymerized part and a yet-unpolymerized part within the photosensitive layer; and
- a peeling development step of removing the yet-unpolymerized part of the photosensitive layer by peeling together with the peeling support layer while leaving the polymerized part of the photosensitive layer on the base layer.

The present invention further provides a printing plate blank, comprising: a base layer, a photosensitive layer susceptible of peeling development, and a photosensitive silver salt layer comprising a photosensitive silver halide, an organic silver salt and a reducing agent; wherein the base layer comprises a polymerizable compound.

The present invention also provides a process for producing a printing plate, comprising:
- an imagewise exposure step of subjecting the above-mentioned plate blank to imagewise exposure,
- a thermal development step of heating the plate blank,
- a polymerization exposure step of subjecting the plate blank to polymerization exposure to form a polymerized part and a yet-unpolymerized part in the photosensitive layer, and a peeling development step of removing the yet-unpolymerized part of the photosensitive layer by peeling together with the photosensitive silver salt layer while leaving the polymerized part of the photosensitive layer on the base layer.

The present invention further provides a printing method, comprising the steps of: supplying an ink to a printing plate produced by a process as described above, and transferring the ink supplied to the printing plate to a recording medium.

The present invention further provides a printing apparatus, including: an ink supply means for supplying an ink to a printing plate produced by a process as described above, and a transfer means for transferring the ink supplied to the printing plate to a recording medium.

These and other objects, features and advantages of the present invention will become more apparent upon a consideration of the following description of the preferred embodiments of the present invention taken in conjunction with the accompanying drawings.

DETAILED DESCRIPTION OF THE INVENTION

First, a description is made to the printing plate blank according to the present invention.

According to a first embodiment, the plate blank comprises a base layer, a photosensitive layer susceptible of peeling development, and a peeling support layer; wherein the base layer comprises a polymerizable compound.

According to a second embodiment, the plate blank comprises a base layer, a photosensitive layer susceptible of peeling development, and a photosensitive silver salt layer comprising a photosensitive silver halide, an organic silver salt and a reducing agent; wherein the base layer comprises a polymerizable compound.

Herein, the photosensitive layer susceptible of peeling development means a photosensitive layer capable of forming a polymerization pattern by a so-called peeling-apart operation after exposure. More specifically, the photosensitive layer susceptible of peeling development means a layer in which a polymerized part and a yet-unpolymerized part are formed corresponding to an exposure pattern and the polymerized part and the yet-unpolymerized part are separated from each other by a peeling-apart operation to leave a polymerization pattern.

Figure 1:
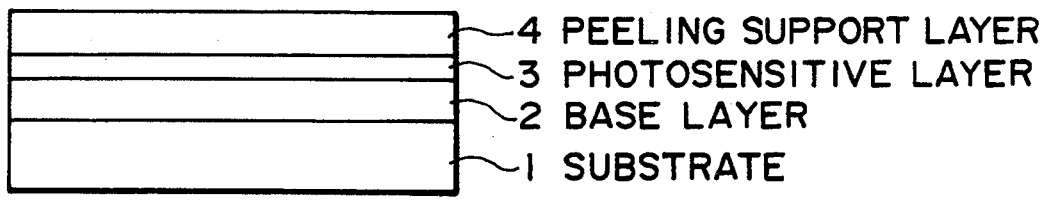
FIGS. 1-3 are respectively a schematic sectional view showing an embodiment of the printing plate blank according to the invention.

The first embodiment of the plate blank according to the invention may, for example, assume a structure, as shown in FIG. 1, comprising a base layer 2, a photosensitive layer 3 susceptible of peeling development, and a peeling support layer 4, successively disposed on a substrate 1.

Figure 2:
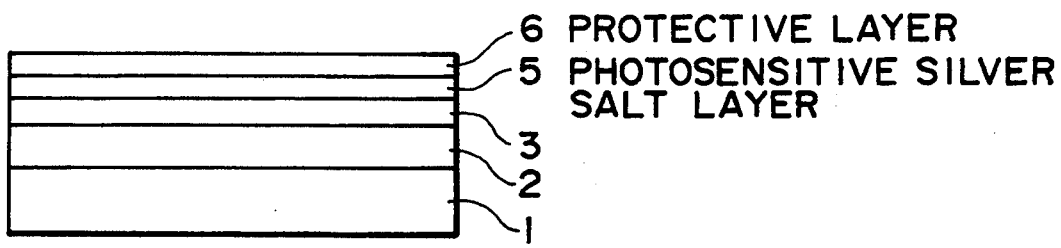
Figure 3:
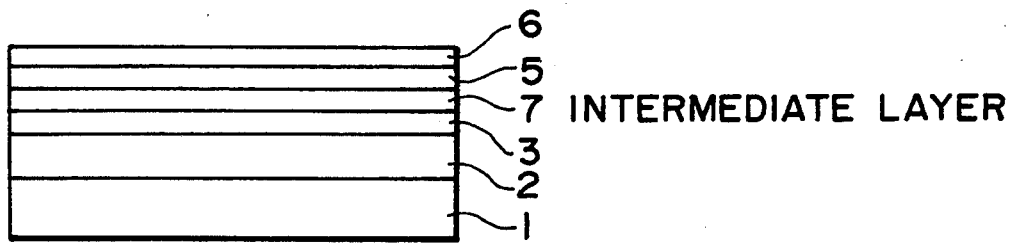

The second embodiment of the plate blank may, for example, assume a structure, as shown in FIG. 2, comprising a base layer 2, a photosensitive layer 3, a photosensitive silver salt layer 5 and a protective layer 6 successively disposed on a substrate 1, or a structure as shown in FIG. 3, wherein an intermediate layer 7 is further disposed between the photosensitive layer 3 and the photosensitive silver salt layer 5.

The substrate 1 used in the plate blank of the present invention may be composed of any material as far as the base layer 2 can firmly adhere thereto, and examples thereof may include: plates of metals, such as aluminum, zinc, copper and steel; films of or films coated with resins, such as polyethylene terephthalate, polyvinyl chloride, and polycarbonate; paper, wet strength-improved paper, resin-coated paper, and paper coated with a foil of a metal, such as aluminum or silver; rubber sheet; glass sheet; and their composites, such as a metal plate, plastic film, glass sheet or paper each coated with a rubber elastic layer, and a metal plate, plastic film, glass sheet or paper each coated with a layer of metal, such as aluminum, zinc, copper, nickel, chromium or iron by plating, vapor deposition or sputtering. Further, it is possible to apply an anchoring agent onto the substrate in order to enhance the adhesion between the substrate 1 and the base layer 2.

The substrate 1 may preferably have a thickness of 1 $\mu$m–5 mm, further preferably 5 $\mu$m–3 mm.

The base layer 2 constituting the plate blank according to the present invention may comprise at least a layer-forming or film-forming polymeric substance and a polymerizable compound. By appropriately selecting the layer-forming polymeric substance, it is possible to provide the base layer 2 with a sufficient dampening water-retentivity or a property of repelling the printing ink without dampening water.

The layer-forming polymeric substance is a polymeric substance capable of forming a layer or a film and may be appropriately selected from a wide scope of resins, which are generally used as binders, depending on the use of the resultant printing plate. It is particularly preferred to use a hydrophilic resin, examples of which may include: plant polymers, such as guar gum, locust bean gum, gum arabic, tragacanth, carrageenan, pectin, mannan, and starch; microorganism polymers, such as xanthane gum, dextrin, succinoglucan, and curdran; animal polymers, such as gelatin, casein, albumin, and collagen; cellulose polymers such as methyl cellulose, ethyl cellulose, and hydroxyethyl cellulose; starch polymers, such as soluble starch, carboxymethyl starch, and methyl starch; alginic acid polymers, such as propylene glycol alginate, and alginic acid salts; other semi-synthetic polymers, such as derivatives of polysaccharides; vinyl polymers, such as polyvinyl alcohol, polyvinylpyrolidone, polyvinyl methyl ether, carboxyvinyl polymer, sodium polyacrylate, and polyacrylamide; and other synthetic polymers, such as polyethylene glycol, ethylene oxide-propylene oxide block copolymer; hydrophilic polymers as disclosed in Japanese Patent Publication (JP-B) 15383/1990 and Japanese Laid-Open Patent Applications (JP-A) 80472/1990, 105873/1990, 238935/1989, 110119/1990, 107678/1990 and 72/1990; resins which per se are hydrophobic but can have hydrophilic groups through hydrolysis or hydrogenolysis in contact with an etchant or dampening water; and resins disclosed in JP-A 306856/1989, 306855/1989, 267093/1989 and 269593/1989. These resins may be used singly or in combination of two or more species.

Into the layer-forming polymeric substance described above, it is possible to mix additives, such as silicon dioxide, titanium dioxide, silica, clay, crosslinking agents (water resistance-imparting agents), and surfactants. The crosslinking agent may be added to impart a water resistance to the above-mentioned hydrophilic resins including many water-soluble resins, and examples thereof may include: melamine-formalin resin, urea-formalin resin, polyamide-polyaminochlorohydrin resin, ketone-formalin resin, methylol-polyamide resin, glyoxal, boric acid, and polyvalent metal salts.

The polymerizable compound may be a compound having at least one reactive vinyl group in its molecule and may comprise one or more species selected from reactive vinyl group-containing monomers, reactive vinyl group-containing oligomers and reactive vinyl group-containing polymers. The reactive vinyl group in these compounds includes substituted or unsubstituted vinyl groups having polymerization reactivity, as exemplified by styrene type vinyl groups, (meth)acrylic acid type vinyl groups, allyl type vinyl groups, and vinyl ether type vinyl groups, as well as ester vinyl groups as in vinyl acetate. Herein, the term (meth)acrylic acid is intended to cover both acrylic acid and methacrylic acid.

The polymerizable compounds may include those showing hydrophilicity by including a hydrophilic group, such as hydroxyl group, alkoxy group, carboxyl group, amide group, imide group, amino-nitrogen-containing group, sulfonyl group, ammonium salt group and phosphoryl group. Specific examples of the hydrophilic polymerizable compounds may include: hydroxyl group-containing polymerizable compounds, such as 2-hydroxyethyl (meth)acrylate, 2-hydroxypropyl (meth)acrylate, butanediol monoacrylate, glycerol mono(meth)acrylate, glycerol di(meth)acrylate, and glycerol methacrylate acrylate; alkoxy group-containing polymerizable compounds, such as 2-methoxybutyl (meth)acrylate, and 2-ethoxyethyl (meth)acrylate; amino nitrogen-containing polymerizable compounds, such as t-butylaminoethyl (meth)acrylate, and N,N-dimethylaminoethyl (meth)acrylate; 1:1 or 1:2-adducts between diols and (meth)acrylacrylic acid, such as polyethylene glycol mono(meth)acrylate, polypropylene glycol mono(meth)acrylate, polyethylene glycol di(meth)acrylate, and neopentyl glycol di(meth)acrylate; 1:2-adducts between diol diglycidyl ethers and (meth)acrylic acid, such as ethylene glycol diglycidyl ether di(meth)acrylate, polyethylene glycol diglycidyl ether di(meth)acrylate, polypropylene glycol diglycidyl ether di(meth)acrylate, neopentyl glycol diglycidyl ether di(meth)acrylate, glycerine diglycidyl ether di(meth)acrylate, bisphenol A diglycidyl ether di(meth)acrylate, trimethylolpropane triglycidyl ether di(meth)acrylate; pentaerythritol derivatives, such as pentaerythritol mono(meth)acrylate, pentaerythritol di(meth)acrylate, pentaerythritol tri(meth)acrylate, dipentaerythritol mono(meth)acrylate, dipentaerythritol di(meth)acrylate, dipentaerythritol tri(meth)acrylate, dipentaerythritol tetra(meth)acrylate, and dipentaerythritol penta(meth)acrylate; (meth)acrylic acid, (meth)acrylic acid metal salts, and (meth)acrylic acid dimers; acrylamide derivatives, such as (meth)acrylamide, dimethylaminopropyl(meth)-acrylamide, N-methylol(meth)-acrylamide, t-butyl(meth)acrylamide, N-methoxymethyl(meth)acrylamide, N-ethoxyethyl(meth)acrylamide, N-n-butoxy(meth)acrylamide, N,N-dimethyl(meth)acrylamide, N,N-dimethylaminopropyl(meth)acrylamide, ethylenedi(meth)acrylamide, propylenedi(meth)acrylamide, 1,4-phenylenedi(meth)acrylamide, ethylenetetra(meth)acrylamide, propylenetetra(meth)acrylamide, methylenebis(meth)acrylamide, acrylamide-glyoxal adduct, acrylamide-methylolethylene urea adduct, 1,3,5-triacryloylhexahydro-s-triazine, N,N-diallylacrylamide, acrylamide-methylolmelamine condensate, acrylamide-methyloltriazine condensate, acrylamide-methylhydantoin condensate, acrylamide-methylol urea, and N,N-diallylacrylamide; sulfonyl group-containing polymerizable compounds, such as 2-(meth)acrylamide-2-methylpropanesulfonic acid; ammonium salt group-containing polymerizable compounds, such as (meth)acrylamide propyltrimethylammonium chloride, and (meth)acryloyloxyethyltrimethylammonium chloride; phosphoryl group containing polymerizable compounds, such as mono(2-(meth)acryloyloxyethyl) acid phosphate; N-(meth)acryloylmorpholine, tetrahydrofurfuryl (meth)acrylate, vinyl acetate, acrylonitrile, N-vinylcaprolactam, N-vinylpyrrolidone; hydrophilic oligomers or polymers (e.g., the above-mentioned hydrophilic resins) retaining a reactive vinyl group at their terminals; and hydrophilic oligomers or polymers having a reactive vinyl group at thin side chain.

It is also possible to use not hydrophilic but lipophilic polymerizable compounds, examples of which may include:

monofunctional monomers such as styrene, methylstyrene, chlorostyrene, bromostyrene, methoxystyrene, dimethylaminostyrene, cyanostyrene, nitrostyrene, hydroxystyrene, aminostyrene, carboxystyrene, methyl (meth)acrylate, ethyl methacrylate, butyl (meth)acrylate, cyclohexyl (meth)acrylate, phenyl (meth)acrylate, vinyl pyridine, propyl vinyl ether, butyl vinyl ether, isobutyl vinyl ether, $\beta$-chloroethyl vinyl ether, phenyl vinyl ether, p-methylphenyl vinyl ether, and p-chlorophenyl vinyl ether;

difunctional monomers such as divinylbenzene, distyryl oxalate, distyryl malonate, distyryl succinate, distyryl glutarate, distyryl adipate, distyryl maleate, distyryl fumarate, distyryl $\beta,\beta'$-dimethylglutarate, distyryl 2-bromoglutarate, distyryl $\alpha, \alpha'$-dichloroglutarate, distyryl terephthalate, oxalic acid di(ethyl (meth)acrylate), oxalic acid di(methyl ethyl (meth)acrylate), malonic acid di(ethyl (meth)acrylate), malonic acid di(methyl ethyl (meth)acrylate), succinic acid di(ethyl (meth)acrylate), glutaric acid di(ethyl (meth)acrylate), adipic acid di(ethyl (meth)acrylate), maleic acid di(diethyl (meth)acrylate), fumaric acid di(ethyl (meth)acrylate), $\beta, \beta'$-dimethylglutaric acid di(ethyl (meth)acrylate), 1,4-phenylenebis(oxyethyl (meth)acrylate), 1,4-phenylenebis(oxymethyl ethyl (meth)acrylate), 1,4-bis((meth)acryloyloxyethoxy)cyclohexane, 1,4-bis((meth)acryloyloxymethylethoxy)cyclohexane, 1,4-bis((meth)acryloyloxyethoxycarbamoyl)benzene, 1,4-bis((meth)acryloyloxymethylethoxycarbamoyl)benzene, 1,4-bis((meth)acryloyloxyethoxycarbamoyl)cyclohexane, and bis(acryloyloxyethoxycarbamoylcyclohexyl)methane;

trifunctional monomers, such as cyanuric acid tri(meth)acrylate, 1,1,1-trimethylolpropane tri(meth)acrylate, cyanuric acid tri(ethyl (meth)acrylate), 1,1,1-trimethylolpropane tri(ethylacrylate), cyanuric acid tri(ethyl vinyl ether), a condensate of a reaction product between 1,1,1-trimethylolpropane and three-fold moles of toluenediisocyanate, with hydroxyethyl acrylate, and a condensate of a reaction product between 1,1,1-trimethylolpropane and three-fold moles of hexanediisocyanate, with p-hydroxystyrene;

tetrafunctional monomers, such as pentaerythritol tetraacrylate; hexafunctional monomers, such as dipentaerythritol hexaacrylate; and further oligomers or polymers having remaining terminal vinyl groups, and oligomers or polymers having side groups including reactive vinyl groups attached thereto. Two or more of these polymerizable compounds can be used in combination.

The polymerizable compound contained in the base layer 2 may preferably have a molecular weight of 80–2000, further preferably 100–1000.

A preferred class of the polymerizable compounds may include those which are not readily dissolved in water but form a dispersion state (including those forming a dispersion state due to standing after dissolution) with water. Examples of the polymerizable compounds in the preferred class may include: 2-hydroxypropyl (meth)acrylate; pentaerythritol derivatives, such as pentaerythritol mono(meth)acrylate, pentaerythritol di(meth)acrylate, pentaerythritol tri(meth)acrylate, pentaerythritol tetra(meth)acrylate, dipentaerythritol mono(meth)acrylate, dipentaerythritol di(meth)acrylate, dipentaerythritol tri(meth)acrylate, dipentaerythritol tetra(meth)acrylate, dipentaerythritol penta(meth)acrylate, and dipentaerythritol hexa(meth)acrylate; tetrahydrofurfuryl (meth)acrylate, and trimethylol-propane triacrylate. Pentaerythritol triacrylate is particularly preferred.

The polymerizable compound in the base layer 2 shows a strong interaction, such as bonding, with the polymerized part of the photosensitive layer 3 susceptible of peeling development, thus causing the polymerized part of the photosensitive layer 3 to firmly adhere to the base layer 2. The adhesion may be attributable to a phenomenon that, when the polymerizable compound is subjected to imagewise exposure for polymerization, resultant radical chains in the polymerized part reacts to the polymerizable compound in the base layer 2 to form some linkage between the polymerized part of the photosensitive layer 3 and the polymerizable compound in the base layer 2. Thus, the adhesion or bonding between the polymerized part of the photosensitive layer 3 and the base layer 2 is not owing to mere viscous adhesion of the base layer 2.

In case where the polymerizable compound contained in the base layer 2 is one not readily soluble in water, the polymerizable compound may be present abundantly at the surface of the base layer at the time of the formation of the base layer presumably similarly as bleeding of a plasticizer in production of a plastic product, so that a further strong adhesion is exhibited between the polymerized part of the photosensitive layer 3 and the base layer 2, thus resulting in a further improved printing durability.

The polymerizable compound in the base layer 2 generally remains yet un-polymerized after the peeling-apart of the yet unpolymerized part of the photosensitive layer 3. The polymerizable compound can be left in this state without serious adverse effects in printing but, if the polymerizable compound in the yet unpolymerized state is further polymerized or crosslinked, the resultant product can exhibit a further enhanced entanglement with the layer-forming polymer in the base layer 2, to provide a state which is insoluble or hardly soluble similarly as in case where a water resistance-imparting agent is used. Depending on the degree thereof, the use of a water resistance-imparting agent can be omitted. Thus, the polymerizable compound in the base layer 2 also shows a function of improving the water resistance of the base layer 2.

In the case where the polymerizable compound in a yet unpolymerized state is polymerized or crosslinked in order to improve the water resistance, it is necessary to have the base layer 2 contain a polymerization initiator, which may be a thermal photopolymerization initiator or a photopolymerization initiator.

The thermal polymerization initiator may be a known initiator, examples of which may include: azo initiators and peroxide initiators. An azo initiator is an organic compound having at least one nitrogen-nitrogen double bond, and examples thereof may include: azobisisobutyronitrile, azobiscyclohexanecarbonitrile, azobismethylphenetylcarbonitrile, azobis-sec-amylonitrile, azobisphenylethane, azobiscyclohexyl-propylonitrile, azobismethylchloroethane, tritylazobenzene, phenylazoisobutyronitrile, and 9-(p-nitrophenylazo)-9-phenylfluorene. Further, a peroxide initiator may be almost any compound having at least one oxygen-oxygen bond, and examples thereof may include: methyl ethyl ketone peroxide, cyclohexane peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1'-bis(tert-butylperoxy)cyclohexane, n-butyl-4,4-bis(tert-butylperoxy)valerate, 2,2'-bis(tertbutylperoxy)butane, tert-butyl hydroperoxide, cumene hydroperoxide, 2,5-dimethylhexane-2-dihydroperoxide, 1,1,3,3-tetramethylbutyl hydroperoxide, di-tert-butyl peroxide, tert-butylcumyl peroxide, dicumyl peroxide, α, α'-bis(tert-butylperoxyisopropyl)benzene, 2,5-dimethyl-2,5-di(tert-butylperoxy)hexane, 2,5-dimethyl-2,5-di(tert-butylperoxy)-hexane-3, acetyl peroxide, isobutyl peroxide, octanoyl peroxide, decanoyl peroxide, lauroyl peroxide, 3,5,5-trimethylhexanoyl peroxide, succinic acid peroxide, benzoyl peroxide, 2,4-dichlorobenzoyl peroxide, m-toluoyl peroxide, diisopropyl peroxydicarbonate, di-2-ethylhexylperoxy-dicarbonate, di-n-propyl peroxydicarbonate, di-2-ethoxyethyl peroxydicarbonate, dimethoxyisopropyl peroxydicarbonate, di(3-methyl-3-methoxybutyl) peroxydicarbonate, tert-butyl peroxyacetate, tert-butyl peroxyisobutyrate, tert-butyl peroxypivalate, tert-butyl peroxyneodecanoate, tert-butyl peroxyoctanoate, tert-butyl peroxy-3,5,5-trimethylhexanoate, tert-butyl peroxylaurate, tert-butyl peroxybenzoate, di-tert-butyldiperoxyisophthalate, 2,5-dimethyl-2,5-di(benzoylperoxy)hexane, tert-butyl peroxymaleate, and tert-peroxyisopropyl carbonate. The above compounds are not exhaustive and other known thermal polymerization initiators may also be used in the present invention.

The photopolymerization initiator may include, for example, carbonyl compounds, sulfur compounds, halogen compounds, and photopolymerization initiators of redox type.

Specifically, the carbonyl compounds include diketones as exemplified by benzil, 4,4'-dimethoxybenzil, diacetyl, and camphorquinone; benzophenones as exemplified by 4,4'-(diethylaminobenzophenone, and 4,4'-dimethoxybenzophenone; acetophenones as exemplified by acetophenone, and 4-methoxyacetophenone; benzoin alkyl ethers; thioxanthones as exemplified by 2-chlorothioxanthone, 2,4-dichlorothioxanthone, 2,4-diethylthioxanthone, and thioxanthone-3-carboxylic acid-$\beta$-methoxy ethyl ester; chalcones and styrylketones having a dialkylamino group; and cumarins as exemplified by 3,3'-carbonylbis(7-methoxycumarin), and 3,3'-carbonylbis(7-diethylaminocumarin).

The sulfur compounds include disulfides as exemplified by dibenzothiazolyl sulfide, and decylphenyl sulfide.

The halogen compounds include, for example, carbon tetrabromide, quinolinesulfonyl chloride, and S-triazines having a trihalomethyl group.

The photopolymerization initiators of redox type include those used in combination of a trivalent iron compound (as exemplified by ferric ammonium citrate) with a peroxide, and those used in combination of a photoreducing coloring matter such as riboflavin or Methylene Blue with a reducing agent such as triethanolamine or ascorbic acid.

In the photopolymerization initiator described above (including the sensitizer), two or more photopolymerization initiators can also be used in combination to effect a more efficient photopolymerization reaction.

Such combination of the photopolymerization initiators includes a combination of styryl ketones or chalcones having a dialkylamino group or cumarins, with S-triazines having a trihalomethyl group or camphorquinone.

In the case where the photosensitive layer 3 is laminated on the base layer 2, the base layer 2 should preferably have a smoothness so that the photosensitive layer 3 adheres thereto on lamination. The base layer 2 may further contain an optional additive, such as a thermal polymerization inhibitor, an antiseptic agent, a halation-preventing dye, an anti-foaming agent, an anti-static agent, a dispersant or an emulsifier.

In case where the base layer 2 exhibits a sufficient shape-retaining strength, the substrate 1 can be omitted.

The base layer 2 may preferably contain the layer-forming polymeric substance in a proportion of 10-98 wt. % thereof, and the polymerizable compound in an amount of 1-1000 wt. parts, further preferably 1-700 wt. parts, per 100 wt. parts of the layer-forming polymeric substance.

The polymerization initiator, when contained in the base layer 2, may preferably be contained in an amount of 0.1-30 wt. parts, further preferably 0.3- 25 wt. parts, per 100 wt. parts of the polymerizable compound.

The base layer 2 may preferably have a thickness of 2-50 $\mu$m, further preferably 5-30 $\mu$m.

In the preparation of a printing plate from the plate blank according to the present invention, there are utilized changes in adhesion at an exposed part and an unexposed part of the photosensitive layer susceptible of peeling development with respect to the base layer 2 and the upper layer (the peeling support layer 4, or the photosensitive silver salt layer 5 or the intermediate layer 7), so that a part of the photosensitive layer 3 showing a large adhesion with respect to the upper layer is removed by peeling together with the upper layer while leaving a part showing a larger adhesion with respect to the base layer 2.

In the present invention, by appropriately formulating the compositions of the photosensitive layer 3, the base layer 2 and the upper layer 4, the exposed part of the photosensitive layer 3 is caused to remain on the base layer 2.

The photosensitive layer 3 comprises at least a polymerizable compound, a layer-forming polymeric substance and a photopolymerization initiator.

The photosensitive layer 3 may be composed from a class of layer-forming polymeric substances enumerated above for constituting the base layer 2. Additional examples of the layer-forming polymeric substances which may be used to constitute the photosensitive layer 3 may include: homopolymers or copolymers, inclusive of chlorinated polyolefins, such as chlorinated polyethylene and chlorinated polypropylene, poly(meth)acrylic acid, polyalkyl (meth)acrylates (preferred alkyls being methyl, ethyl and butyl), copolymers of alkyl (meth)acrylates (preferred alkyls being methyl, ethyl and butyl) with at least one monomer, such as acrylonitrile, vinyl chloride, vinylidene chloride, styrene or butadiene, polyvinyl chloride, vinyl chloride-acrylonitrile copolymer, polyvinylidene chloride, vinylidene chloride-acrylonitrile copolymer, polyvinyl acetate, vinyl acetate-vinyl chloride copolymer, polyvinyl alcohol, polyvinylpyrrolidone, polyacrylonitrile, acrylonitrile-styrene copolymer, acrylonitrile-butadiene-styrene copolymer, polyvinyl alkyl ethers (preferred alkyls being methyl, ethyl, isopropyl and butyl), polyethylene, polypropylene, polybutylene, polystyrene, poly-a-methylstyrene, polyamides (preferably 6-nylon, 6,6-nylon and 6,10-nylon), poly-1,3-butadiene, polyisoprene, polyurethane, polyesters (preferably, linear saturated polyesters such as polyethylene terephthalate and polyethylene isophthalate), chlorinated rubber, polychloroprene, polyvinyl butyral, polyvinylformal, styrene-butadiene rubber, and polychlorosulfonated ethylene.

Among the above, it is particularly preferred to use chlorinated polyolefins represented by chlorinated polyethylene and chlorinated polypropylene, polymethyl methacrylate, chlorinated rubber, and polyvinyl chloride. These substances may be used above or in mixture of two or more species.

In the preparation of a printing plate from the plate blank according to the present invention, the plate blank may be heated simultaneously with or after the imagewise exposure in some cases, as will be described in further detail hereinafter. In such a case of accompanying a heat treatment in preparation of a printing plate, the photosensitive layer can cause thermal degradation or a change in mutual solubility among the components thereof, so that a portion of the yet unpolymerized part of the photosensitive layer can remain or the surface of the polymerized part of the photosensitive layer can become uneven after the peeling development. When such a printing plate is used for printing, clear images cannot be obtained.

In the case of applying a heat treatment in preparation of a printing plate, particularly before the peeling development of the photosensitive layer, it is preferred to use a mixture of chlorinated polyolefin and a linear saturated polyester as a layer-forming polymeric substance. The chlorinated polyolefin may preferably be, e.g., chlorinated polyethylene or chlorinated polypropylene. The linear saturated polyester may preferably be one having a basic skeleton comprising terephthalic acid and ethylene glycol and having a carboxyl group, a hydroxyl group or both group at its both ends. The linear saturated polyester can contain, in its basic skeleton, an ester combination including one or both of a dibasic acid other than terephthalic acid, and a dihydric alcohol other ethylene glycol.

Even when the linear saturated polyester alone is used as the layer-forming polymeric substance of the photosensitive layer 3, it is possible to obtain a preferred image. If the chlorinated polyolefin is mixed therewith, however, it is possible to obtain better images characterized by improved solution and edge sharpness. It is preferred to mix the chlorinated polyolefin in a proportion of 0.1–300 wt. parts, further 0.5–100 wt. parts, particularly 1.0–50 wt. parts, with 100 wt. parts of the linear saturated polyester.

Incidentally, of course, the chlorinated polyolefin/linear saturated polyester mixture can be also used in case where no heating step is involved in the plate production.

The polymerizable compound contained in the photosensitive layer 3 may be selected from a similar class of polymerizable compounds as enumerated above for constituting the base layer 2. The polymerizable compound may have a molecular weight which can range over a wide range including from a small one to a large one but may preferably be in the range of $80-10^6$, further preferably $100-6 \times 10^5$. The molecular weight of the polymerizable compound in a large value region may be based on values measured by GPC (gel permeation chromatography) calibrated as corresponding to molecular weights of standard polystyrene samples. A smaller molecular weight value of a polymerizable compound may be determined from its molecular structure.

The photopolymerization initiator contained in the photosensitive layer 3 may also be selected from a similar class of the photopolymerization initiators enumerated above for constituting the base layer 2.

Further, in addition to those enumerated above for the base layer 2 the polymerizable compound contained in the photosensitive layer 3 may be selected from an additional class of polymerizable compounds including: fluoro(meth)acrylates or fluorine-containing (meth)acrylates, such as 2,2,2-trifluoroethyl (meth)acrylate, 2,2,3,3-tetrafluoropropyl (meth)acrylate, 1H,1H,5H-octafluoropentyl (meth)acrylate, and 1H,1H,2H,2H-heptafluorodecyl (meth)acrylate; and silicone (meth)acrylates, such as silicone di(meth)acrylate, and silicone hexa(meth)acrylate. If such a fluoro(meth)acrylate or a silicone (meth)acrylate is used as a polymerizable compound constituting the photosensitive layer 3, the water-repelling of the polymerized part of the photosensitive layer 3 can be enhanced.

The photosensitive layer 3 may preferably contain the layer-forming polymeric substance in a proportion of 20–80 wt. %, further preferably 30–70 wt. %, thereof.

The polymerizable compound in the photosensitive layer 3 may preferably be used in an amount of 10–300 wt. parts, further preferably 20–200 wt. parts, per 100 wt. parts of the layer-forming polymeric substance.

The photopolymerization initiator may preferably be contained in a proportion of 0.1–30 wt. parts, further preferably 0.3–25 wt. parts, per 100 wt. parts of the polymerizable compound.

The photosensitive layer 2 can further contain an optional additive, such as a thermal polymerization inhibitor for preventing dark polymerization during storage, a colorant for facilitating plate inspection, or a plasticizer, as desired.

The thermal polymerization inhibitor may include, for example: p-methoxyphenol, hydroquinone, phenothiazine, pyrogallol, naphthylamine, $\beta$-naphthol, and tert-butylcatechol.

The colorant may include, for example: dyes or pigments of the phthalocyanine type and the azo type, Methylene Blue, Crystal Violet, and Rhodamine B.

The plasticizer may include, for example: phthalic acid esters, such as dicyclohexyl phthalate and dimethyl phthalate, glycol esters, such as dimethyl glycol phthalate, and phosphoric acid esters, such as triphenyl phosphate.

The photosensitive layer 3 may have a thickness of 0.2–50 μm, preferably 0.3–20 μm, further preferably 0.3–10 μm, particularly 0.5–5 μm.

The peeling support layer 4 is a layer to be peeled apart from the plate blank for peeling development of the photosensitive layer 3 after the imagewise exposure, and may for example be formed from materials, such as: polyethylene terephthalate, polypropylene, cellulose diacetate, cellulose triacetate, cellulose acetate butyrate, cellulose acetate propionate, acetylcellulose, cellophane, methyl cellulose, ethyl cellulose, polyvinyl chloride, vinyl chloride-vinylidene chloride copolymer, polyvinylidene chloride, polystyrene, polyvinyl alcohol, polycarbonate, gelatine, and polyamides (such as, 6-nylon, 6,6-nylon, and 6,10-nylon). It is also possible to use two or more species of these materials in mixture or in lamination.

In case where the substrate 1 and the base layer 2 are transparent to light having a wavelength range including an absorption wavelength of the photopolymerization initiator contained in the photosensitive layer 3, the peeling support layer can be optically nontransparent. In order to obtain a better resolution, however, the peeling support layer 4 may preferably be optionally transparent.

The peeling support layer 4 may preferably have a thickness of 0.5–300 μm, further preferably 2–50 μm. A smaller thickness is preferred in view of a better resolution when the photosensitive layer 3 is exposed through the peeling support layer 4.

Referring to the embodiments shown in FIGS. 2 and 3, the photosensitive silver salt layer 5 comprises at least a photosensitive silver halide, an organic silver salt and a reducing agent (so as to form a so-called dry silver salt composition).

Examples of the photosensitive silver halide may include: silver chloride, silver bromide, silver chlorobromide, silver iodobromide, and silver chlorobromide, silver iodobromide, and silver chloroiodobromide. It is also possible to use a combination of two or more species of silver halides differing in halogen species, particle size and/or particle size distribution. These may have been subjected to spectral sensitization or chemical sensitization, with dyes etc.

The organic silver salt may include, for example: silver salts of aliphatic carboxylic acids, aromatic carboxylic acids, thiocarbonyl compounds having a mercapto group or a-hydrogen, and imino group-containing compounds.

The aliphatic carboxylic acids include acetic acid, butyric acid, succinic acid, sebacic acid, adipic acid, oleic acid, linolic acid, linolenic acid, tartaric acid, palmitic acid, stearic acid, behenic acid and camphor acid. In general, however, silver salts are less stable as they have a smaller number of carbon atoms, and hence those having an appropriate number of carbon toms (as exemplified by those having 16 to 26 carbon atoms) are preferred.

The aromatic carboxylic acids include benzoic acid derivatives, quinolinic acid derivatives, naphthalenecarboxylic acid derivatives, salicylic acid derivatives, gallic acid, tannic acid, phthalic acid, phenylacetic acid derivatives, and pyromellitic acid.

The compounds having a mercapto group or thiocarbonyl group having α-hydrogen include 3-mercapto-4-phenyl-1,2,4-triazole, 2-mercaptobenzoimidazole, 2-mercapto-5-aminothiadiazole, 2-mercaptobenzothiazole, s-alkylthioglycolic acid (alkyl group carbon atom number of 12 to 22), dithiocarboxylic acids such as dithioacetic acid, thioamides such as thiostearoamide, and mercapto compounds such as 5-carboxy-1-methyl-2-phenyl-4-thiopyridine, mercaptotriazine, 2-mercaptobenzoxazole, mercaptooxadiazole, and 3-amino-5-benzylthio-1,2,4-triazole, which are described in U.S. Pat. No. 4,123,274.

The compounds having an imino group typically include benzotriazole or derivatives thereof, described in Japanese Patent Publication JP-B 44-30271 or JP-B 42-18416, as exemplified by benzotriazole and alkyl-substituted benzotriazoles such as methylbenzotriazole, halogen-substituted benzotriazoles such as 5-chlorobenzotriazole, carboimidobenzotriazoles such as butylcarboimidobenzotriazole, nitrobenzotriazoles, described in Japanese Laid-Open Patent Application JP-A 58-118638, sulfobenzotriazole, carboxybenzotriazole or salts thereof, or hydroxybenzotriazole, described in Japanese Laid-Open Patent Application JP-A 58-118639, 1,2,4-triazole, described in U.S. Pat. No. 4,220,709, or 1H-tetrazole, carbazole, saccharin, imidazole, and derivatives thereof.

The reducing agent may preferably be a compound which reduces the organic silver salt to produce elemental silver forming a black silver image or which is converted into an image of oxidation product by the reaction with the organic silver salt. Such a reducing agent may be appropriately selected depending on the kinds of the polymerization initiator and the organic silver salt used together therewith. In the case where a photopolymerization initiator is used as the polymerization initiator, suitable examples of the reducing agent may include: monophenols, bisphenols, trisphenols, tetrakisphenols, mononaphthols, bisnaphthols, dihydroxynaphthalenes, trihydroxynaphthalenes, dihydroxybenzenes, trihydroxybenzenes, tetrahydroxybenzenes, hydroxyalkyl monoethers, ascorbic acids, 3-pyrazolidones, pyrazolines, pyrazolones, phenylenediamines, hydroxyamines, reductons, hydroxamic acids, hydrazines, amidoximes, and N-hydroxyureas. These reducing agents may be used singly or in combination of two or more species. Specific examples of the reducing agent are disclosed in JP-A 51-22431; U.S. Pat. Nos. 3,615,533; 3,679,426; 3,672,904; 3,751,252; 3,751,255; 3,782,949; 3,801,321; 3,794,488; 3,893,863; 3,887,376; Belgium Patent No. 786,086; U.S. Pat. Nos. 3,770,448; 3,819,382; 3,773,512; 3,928,686; 3,839,048; 3,887,378; JP-B 51-35851; JP-A 50-36143; U.S. Pat. Nos. 3,827,889 and 3,756,829; JP-A 50-36110; JP-A 50-16023; JP-A 50-147711; JP-A 51-23721, JP-A 50-99719; JP-A 51-32324; JP-A 51-51933; JP-A 50-140113; JP-A 52-84727; JP-A 63-250174; and U.S. Pat. No. 3,589,903.

In order to obtain a large contrast in respect of light absorption (or transmittance) between the exposed part and the unexposed part, it is preferred that the oxidation product formed at the exposed part has a large molar decadic absorption coefficient. Preferred examples of the reducing agent providing such an oxidation product may include aromatic hydroxy compounds, which will be described in some detail hereinbelow.

The compounds represented by the following formulae (1) and (2) are examples of such aromatic hydroxy compounds that provide an oxidation product through a redox reaction with an organic silver salt, which oxidation product absorbs a wavelength of light sensible by the photopolymerization initiator in the photosensitive layer 3, thus exhibiting a polymerization inhibiting performance:

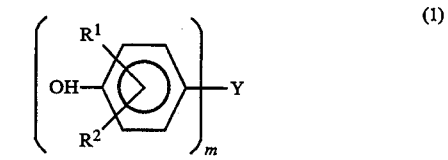

(1)

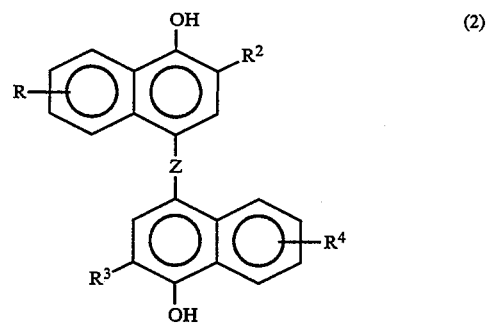

(2)

In the above formulae (1) and (2), $R^1$, $R^2$ and $R^3$ each independently denote a hydrogen atom, a halogen atom, a substituted or unsubstituted cycloalkyl group, a substituted or unsubstituted aralkyl group; R and $R^4$ each independently denote a hydrogen atom, a halogen atom, a substituted or unsubstituted alkyl group, a substituted or unsubstituted aryl group, a substituted or unsubstituted aralkyl group, or alkoxy group; m denotes a positive number of 1-3, , Y is a monovalent, divalent or trivalent group and represents a substituted or unsubstituted aralkyl group, a substituted amino group, an alkylidene group, a substituted or unsubstituted aralkylidene group, or a methine group; and Z denotes an alkylidene group, or a substituted or unsubstituted aralkylidene group.

In the above formulae (1) and (2), the unsubstituted alkyl group may be a linear or branched alkyl group, etc. having 1-18 carbon atoms, and examples thereof may include: methyl, ethyl, propyl, i-propyl, butyl, t-butyl, i-butyl, amyl, i-amyl, secamyl, texyl (i.e., 1,1,2,2-tetramethylethyl), hexyl, heptyl, octyl, nonyl, dodecyl, and stearyl.

The substituted alkyl group may include an alkoxyalkyl group having 2-18 carbon atoms, a halogenoalkyl group having 1-18 carbon atoms, an aminoalkyl group having 1-18 carbon atoms, etc. Examples of the alkoxyalkyl group may include: methoxyethyl, ethoxymethyl, ethoxyethyl, ethoxypropyl, ethoxybutyl, propoxymethyl, propoxybutyl, i-propoxypentyl, t-butoxyethyl, and hexyloxybutyl. Examples of the halogenoalkyl groups may include: chloromethyl, chloroethyl, bromoethyl, chloropropyl, chlorobutyl, chlorohexyl, and chlorooctyl. Examples of the hydroxyalkyl group may include: hydroxymethyl, hydroxyethyl, hydroxypropyl, hydroxybutyl, hydroxypentyl, hydroxyhexyl, and hydroxyheptyl. Examples of the aminoalkyl group may include: aminomethyl, acetylaminomethyl, dimethylaminomethyl, aminoethyl, acetylaminoethyl, dimethylaminoethyl, diethylaminoethyl, morpholinoethyl, piperidinoethyl, diethylaminopropyl, dipropylaminoethyl, acetylaminopropyl, aminobutyl, and morpholinoaminobutyl.

Examples of the cycloalkyl group may include: cyclopentyl, cyclohexyl, and cycloheptyl. The aralkyl group may, for example, include: benzyl, chlorobenzyl, and phenethyl:

The aryl group may have 6–16 carbon atoms, and preferred examples thereof may include: phenyl, naphthyl, anthryl, tolyl, xylyl, cumenyl, mesityl, chlorophenyl, methoxyphenyl, and fluorophenyl.

The alkoxyl group may have 1–18 carbon atoms, and preferred examples thereof may include: methoxy, ethoxy, propoxy, i-propoxy and butoxy.

Preferred example of the substituted for $R^2$ and $R^3$ may include: chlorine atom, bromine atom, methyl, ethyl, i-propyl, t-butyl, sec-amyl, texyl, ethoxymethyl, ethoxyethyl, chloromethyl, hydroxymethyl, aminomethyl, dimethylaminomethyl, and benzyl. Particularly preferred substituents are chlorine atom, t-butyl and texyl.

Preferred examples of the substituted for $R^1$ may include: chlorine atom, methyl, ethyl, i-propyl, t-butyl, amyl, texyl, hydroxyl, chloromethyl, hydroxymethyl, benzyl and cyclohexyl. Particularly preferred substituents are chlorine atom, methyl, t-butyl and texyl.

Examples of the substituted or unsubstituted aralkyl group as a monovalent group Y may include: benzyl, p-methoxybenzyl, p-N,N-dimethylaminobenzyl, p-pyrrolidinobenzyl, p-methylbenzyl, p-hydroxybenzyl, p-chlorobenzyl, 3,5-dichloro-4-hydroxybenzyl, o,p-dimethylbenzyl, 2-hydroxy-3-t-butyl-5-methylbenzyl, and naphthylmethyl.

Examples of the alkylidene group as a divalent group Y may include: methylene, ethylidene, propylidene, and butylidene.

Examples of the aralkylidene group as a divalent group Y may include: benzylene, p-methylbenzylene, and p-dimethylaminobenzylene.

Examples of the reducing agent represented by the formula (1) may include: 2,6-di-t-butyl-4-(2-hydroxy-3-t-butyl-5-methylbenzyl)phenol, 2,6-di-t-butyl-4-(3,5-dichloro-4-hydroxybenzyl)phenol, 2-t-butyl-4-(2-hydroxy-3,5-dimethylbenzyl)-5-methylphenol, 4,4'-methylenebis(2,6-di-t-butylphenol), 4,4'-methylenebis(2-t-butyl-5-methylphenol), 4,4'-methylidenebis(2-t-butyl-6-methylenephenol), 4,4'-ethylidenebis(2,6-di-t-butylphenol), 4,4'-ethylidenebis(2-t-butyl-6-methylphenol), 4,4'-propylidenebis(2,6-di-t-butylphenol), 4,4'-butylidenebis(2,6-di-t-butylphenol), 4,4'-butylidenebis(2-cyclohexyl-6-methylphenol), bis(3,5-di-t-butyl-4-hydroxyphenyl)phenylmethane, bis(3,5-di-t-butyl-4-hydroxyphenyl)(4-methoxyphenyl)-methane, bis(3,5-di-t-butyl-4-hydroxyphenyl)(4-dimethylaminophenyl)methane, and tris(3,5-di-t-butyl-4-hydroxyphenyl)methane.

Examples of the reducing agent represented by the formula (2) may include: 4,4'-methylenebis(2-methyl-1-naphthol), 4,4'-methylenebis(2-t-butyl-1-naphthol), 4,4'-methylenebis(2-t-butyl-6-methyl-1-naphthol), 4,4'-ethylidenebis(2-methyl-1-naphthol), 4,4'-ethylenebis(2-t-butyl-1-naphthol), and bis(4-hydroxy-3-methylnaphthyl)phenylmethane.

The reducing agents represented by the formulae (1) and (2) can provide a polymerization image having a good contrast when combined with an appropriately selected photopolymerization initiator in the photosensitive layer 3.

For example, when 4,4'-ethylenebis-(2-methyl-6-t-butylphenol) or 4,4'-methylenebis(2,6-di-tbutylphenol) is used as the reducing agent, it is preferred to use a photopolymerization initiator having a sensitivity at 380 nm–390 nm, such as 2-chlorothioxanthone, 2-methylthioxanthone, 2,4-dimethylthioxanthone, 2,4-diethylthioxanthone, 2,4,6-trimethylbenzoyldiphenylphosphine oxide, or benzil.

Further, when 4,4'-methylenebis(2-methyl-1-naphthol), 4,4'-methylenebis(2-ethyl-1-naphthol) or 4,4'-methylenebis(2,6-di-t-butylphenol) is used, it is preferred to use a photopolymerization initiator having a sensitivity at 400–500 nm, such as 2,4-dichlorothioxanthone, camphorquinone, a combination of a coumarin compound such as 3,3'-carboxylbis(7-diethylaminocoumarin) with tris(trichloromethyl)tiazine, a combination of 2-(p-dimethylaminostyryl)-4,5-diphenylthiazole with 3-phenyl-5-isoxazolone, or a combination of a merocyanine dye with 3-phenyl-5-isoxazolone.

The photosensitive silver salt layer 5 in the plate blank according to the invention may preferably comprise the above-mentioned components in properties as described below.

The organic silver salt may preferably be contained at a rate of 0.3–30 $g/cm^2$, further preferably 0.7–15 $g/cm^2$, particularly 1.2–8 $g/m^2$ of the photosensitive silver salt layer 5.

With respect to 1 mol of the organic silver salt, the photosensitive silver halide may preferably be used in 0.001 mol–2 mol, more preferably 0.05 mol –0.4 mol. The reducing agent may preferably be used in 0.2 mol–3 mol, more preferably 0.7 mol–1.3 mol per mol of the organic silver salt.

The photosensitive silver salt layer 5 may preferably have a thickness of 0.05 $\mu$m–1 mm, further preferably 0.3 $\mu$m–30 $\mu$m.

It is preferred to further dispose a protective layer 6 on the photosensitive silver salt layer 5. The protective layer 6 functions to prevent the photosensitive silver salt layer from adhering or sticking onto another material or to prevent the permeation of atmospheric moisture.

The protective layer 6 may be composed of a material similar to those enumerated for the peeling support layer 4. The protective layer 6 may preferably have a thickness of 0.2–300 $\mu$m, further preferably 0.5–50 $\mu$m, particularly 0.5–20 $\mu$m.

The protective layer 6 can be endowed with a function of filtering light in a prescribed wavelength region by inclusion of a light-absorbing dye. It is further possible to incorporate various additives for various purposes optionally as desired.

Referring to FIG. 3 directed to the second embodiment, it is possible to dispose an intermediate layer 7 between the photosensitive layer 3 and the photosensitive silver salt layer 5. The intermediate layer 7 may preferably comprise a film providing a uniform surface and showing a good optical transmittance in the wavelength region to which the photosensitive layer 3 is sensitive. The intermediate layer 7 may be composed of a material similar to that constituting the above-mentioned peeling support layer 4. The intermediate layer 7 may preferably have a thickness of 0.5–300 μm, further preferably 2–50 μm.

The intermediate layer 7 can contain a halation-preventing dye so as to have a halation-preventing function. Alternatively it is also possible to dispose a halation-preventing layer between the intermediate layer 7 and the photosensitive silver salt layer 5.

The provision of the intermediate layer 7 is effective for preventing mixing due to thermal diffusion of the components of the photosensitive layer 3 and the photosensitive silver salt layer 5 liable when the layers 3 and 5 are directly laminated with each other, for improving the preservability, and for preventing the mixing of the components of the layers 3 and 5 at the time of formation of these layers by application. As the mixing of the components of these layers 3 and 5 is effectively prevented by the inclusion of the intermediate layer 7, the materials for these layers 3 and 5 can be easily selected from a wider scope of materials.

In the present invention, the photosensitive layer 3 may preferably have a contact angle (intended herein to mean an angle of contact with water) which is larger than that of the base layer 2. More specifically, the photosensitive layer 3 may preferably have a contact angle of at least 60 degrees, further preferably 70 degrees to 130 degrees. The base layer 2 may preferably have a contact angle of at most 58 degrees, further preferably at most 50 degrees, particularly 1–20 degrees.

The above-mentioned contact angle relationship between the photosensitive layer 3 and the base layer 2 is particularly advantageous in a printing method using dampening water as will be described hereinafter.

The contact angle measurement may be performed by using a contact angle meter (e.g., Model "CAS-150", available from Kyowa Kaimen Kagaku K.K.) and by placing a water droplet with a diameter of about 1.5 mm on a layer concerned to measure the contact angle at a time of 10 seconds after the instant of the placement.

Next, the plate production process according to the present invention will be described.

First, a plate production process using a plate blank of the first embodiment will be described.

A plate blank of the first embodiment as shown in FIG. 1 is prepared by coating a substrate 1 with a base layer 2, separately coating a peeling support layer 4 with a photosensitive 3, and laminating the thus-coated substrate 1 and the peeling support layer 4 so that the base layer 2 and the photosensitive layer contact each other. At the time of lamination, it is preferred to heat the structure to 20°–150° C., further preferably 30°–100° C., particularly preferably 40°–80° C.

Alternatively, such a plate blank of the first embodiment may also be prepared by coating the substrate 1 successively with the base layer 2 and the photosensitive layer 3, followed by lamination with the peeling support layer 4.

Figure 4:
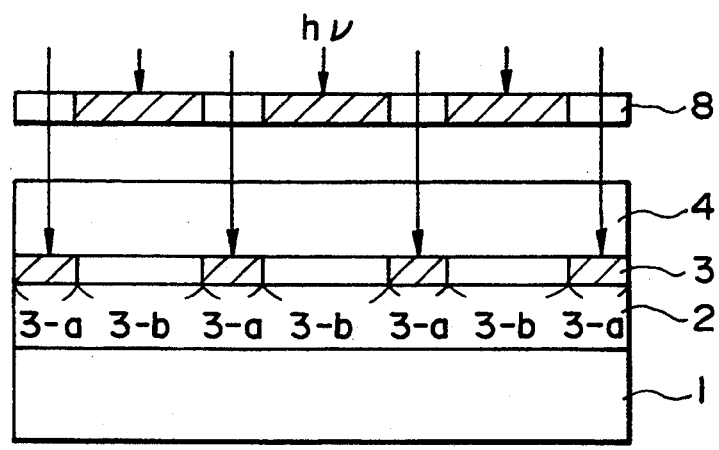
FIGS. 4 and 6 are respectively a schematic sectional illustration of an example of the imagewise exposure step in the plate production process according to the invention.
Figure 5:
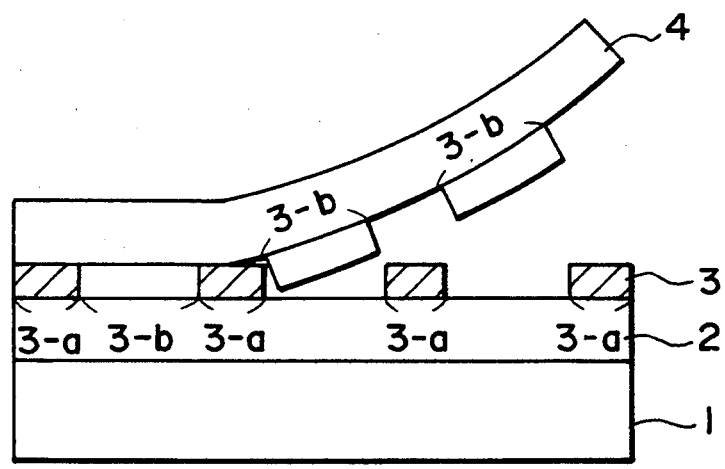
FIGS. 5 and 9 are respectively a schematic sectional illustration of an example of the peeling development step in the plate production process according to the invention.

In an imagewise exposure step as illustrated in FIG. 4, the photosensitive layer 3 in the plate blank is exposed imagewise through a prescribed mask 8 to light including a wavelength to which the photopolymerization initiator in the photosensitive layer 3 is sensitive, thus polymerizing the polymerizable compound in the photosensitive layer 3 to form a latent image comprising a polymerized part 3-a and a yet unpolymerized part 3-b in the photosensitive layer 3.

For the plate blank of the first embodiment,. light having a wavelength in the range of 300–600 nm may preferably be used in the imagewise exposure step.

The mask 8 may be one having a light-transmissive part and a light-nontransmissive part.

Instead of exposure through a mask, analog exposure or digital exposure may also be used. The exposure light source may, for example, be sunlight, a tungsten lamp, a mercury lamp, a halogen lamp, a xenon lamp, or a fluorescent lamp. The exposure without using a mask may be performed by using a liquid crystal shutter array, a CRT or optical fiber tube, or by using laser beam, electron beam or X-rays.

In the exposure step, it is very preferable to exercise heating simultaneously with the exposure. This is effective for increasing the polymerization speed of the polymerizable compound and for promoting the bonding between the polymerizable compound in the base layer 2 and the polymerizable compound in the photosensitive layer 3 through relaxation of the matrix of the layer-forming polymeric substance in the base layer 2, thus providing a further improved printing durability.

The heating may be performed by any means but preferably by using a hot plate, a heating roller, a thermal head, etc.

The heating temperature may preferably be 30°–150° C., further preferably 50°–120° C., while it depends on the composition of the photosensitive layer 3 and the composition (particularly, the layer-forming polymeric substance) of the base layer 2.

From the plate blank having a polymerization latent image thus formed, the peeling support layer 4 is removed by peeling-agent as shown in FIG. 4, when the yet unpolymerized part 3-b of the photosensitive layer 3 is attached to and removed together with the peeling support layer 4.

Through the above steps, a printing plate having the polymerized part 3-a remaining on the base layer 2 is obtained.

The resultant printing plate in this state can show a preferable printing durability and can be used for printing as it is. It is however preferred to heat the printing plate by a hot plate, a heating roller, etc., so as to provide a further improved printing durability. The heating temperature at this time may preferably be 50°–200° C., further preferably 80°–180° C., while it can depend on the composition, glass transition temperature and softening temperature of the photosensitive layer polymerized part 3-a and the composition of the base layer 2.

It is further preferred to apply a pressure. to the printing plate by a press, a roller, etc., so as to provide a further improved printing durability. It is possible to apply both the heat and pressure, which may be simultaneously.

The pressure applied should be within an extent of not collapsing the photosensitive layer polymerized part 3-a and desirably be 0.2–15 kg/cm², preferably 1–10 kg/cm².

It is also preferred to expose the printing plate with the light used in the imagewise exposure step. This additional exposure is also effective for improving the printing durability. The improvement in printing durability may be attributable to a phenomenon that the portion of the photopolymerization initiator remaining in the polymerized part 3-a of the photosensitive layer 3 is activated by the additional exposure to promote further linkage between the yet unreacted polymerizable compound at the polymerized 3-a and the yet unreacted polymerizable compound in the base layer 2. It is also preferred to apply heat or/and pressure simultaneously with the additional exposure. Particularly, a remarkably improved printing durability is attained when the printing plate is heated by a hot plate, etc., simultaneously with exposure in the additional exposure step, and then further subjected to application of heat and pressure, e.g., by heating rollers, etc.

A plate blank of the second embodiment shown in FIG. 2 may be prepared by successive formation by application or lamination of the respective layers. Further, a plate blank shown in FIG. 3 may be prepared, for example, in the following manner.

A photosensitive layer 3 is applied as a coating on an intermediate layer 7 of, e.g., polyethylene terephthalate and then temporarily covered by lamination with a protective film of a plastic film coated with a fluorine-containing resin or a silicone resin. The protective film is different from the protective layer 6 shown in FIGS. 2 and 3, is temporarily disposed for preventing damage or dust attachment to the photosensitive layer 3 during the process of production of the plate blank, and is removed immediately before lamination of the photosensitive layer 3 with the base layer 2. The fluorine-containing resin used for constituting the protective film may include, e.g., polytetrafluoroethylene, tetrafluoroethylene-perfluoroalkyl vinyl ether copolymer, tetrafluoroethylene-hexafluoropropylene copolymer, and tetrafluoroethylene-hexafluoropropylene-perfluoroalkyl vinyl ether copolymer.

Then, on the remaining surface of the intermediate layer 7 opposite to the side having the photosensitive layer 3 thereon, a photosensitive silver salt layer 5 is formed and then covered by lamination with a protective layer 6.

Separately, a base layer 2 is formed on a substrate 1 and then laminated with the above-prepared laminated structure so as to contact the photosensitive layer 3 after removing the temporary protective layer, whereby a plate blank as shown in FIG. 3 is obtained.

Hereinbelow, a plate production process using a plate blank shown in FIG. 3 is described, whereas it would be readily understood that a similar process may be accomplished also by using a plate blank shown in FIG. 2.

Figure 6:
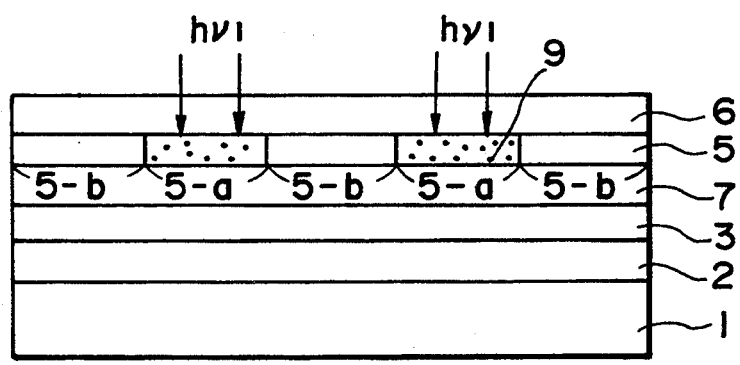

As shown in FIG. 6 for illustration of an imagewise exposure step, the photosensitive silver layer 5 is exposed to a prescribed light image (h$\nu_1$) as by analog imagewise exposure or digital exposure. As a result, silver nuclei 9 are formed from the photosensitive silver halide at the exposed part 5-a, thus forming a latent image. The silver nuclei 9 function as a catalyst for a thermal reaction between the organic silver salt and the reducing agent in the photosensitive silver salt layer 5.

The plate blank of the second embodiment allows a high-sensitivity writing and direct drawing (or scanning) in a digital manner by using a laser beam or an LED beam, etc.

Figure 7:
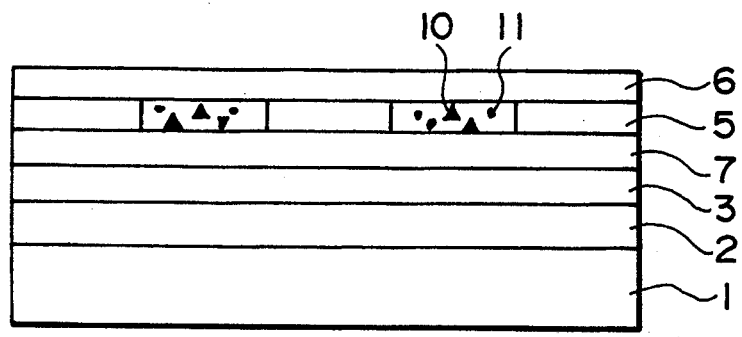
FIG. 7 is a schematic illustration of an example of the thermal development step in the plate production process according to the invention.

Then, as shown in FIG. 7 for illustration of a thermal development step, when the photosensitive silver salt layer 5 having a latent image therein, the organic silver salt and the reducing agent react with each other selectively at the exposed part 5-a in the presence of the silver nuclei 9 functioning as a catalyst, whereby the organic silver salt is reduced into elemental silver 10 and the reducing agent is converted into an oxidized product 12.

The heating conditions in the thermal development step can depend on factors, such as the composition of the layer 5, but may include a heating temperature of 60°-200° C., preferably 70°-150° C., and a heating time of 1 sec to 5 min, preferably 3 sec to 60 sec. Generally, a shorter time is sufficient at a higher temperature and a longer time is required at a lower temperature. The heating may be performed by using a heating means, such as a hot plate, a heat roller or a thermal head, or by laser light irradiation.

Figure 8:
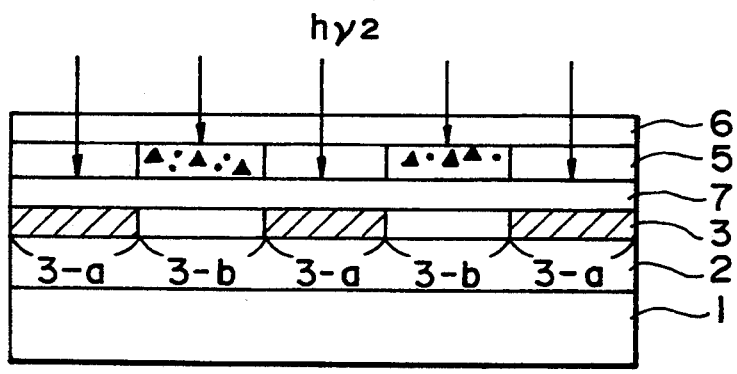
FIG. 8 is a schematic illustration of an example of the thermal development step in the plate production process according to the invention.

Then, as shown in FIG. 8 for illustration of a polymerization exposure step, substantially the entire free surface of the plate blank is uniformly exposed to light (h$\nu_2$) from the side of the protective layer 6 so as to expose the photosensitive layer 3 through the photosensitive silver salt layer 5, whereby the photopolymerization initiator in the photosensitive 3 is decomposed to generate radicals, by which the polymerizable compound is polymerized to form a polymerized part. More specifically, in this instance, at the exposed part 5-a of the photosensitive silver salt layer 5, the light is absorbed by the black elemental silver 10 and oxidized product 11 so that the polymerizable compound in the photosensitive layer 3 is not polymerized at a part corresponding to the exposed part 5-a of the photosensitive silver salt layer 5 to form a yet unpolymerized part 3-b but is polymerized at a part corresponding to the unexposed part 5-b to form a polymerized part 3-a, thus forming a polymerization latent image.

In the imagewise exposure step and polymerization exposure step described above, various light sources may be used, including: sunlight, tungsten lamps, mercury lamps, halogen lamp, xenon lamps, fluorescent lamps, LED and laser, which may be used for direct drawing or through a mask as shown. The wavelengths of light used in these two steps may be the same or different. More specifically, it is possible to use an identical wavelength of light in both the imagewise exposure step and the polymerization exposure step because a silver halide contained in the layer 5 has a sufficiently higher sensitivity than a photopolymerization initiator contained in the layer 3 and can cause a sufficient latent image formation at an intensity of light not causing photopolymerization in the imagewise exposure step. It is possible to incorporate a sensitizing dye into the respective layers at the time of forming these layers corresponding to a spectral intensity of the respective light sources.

More specifically, it is preferred to use light having a wavelength of 300-600 nm in the polymerization exposure step. On the other hand, in the imagewise exposure step, the wavelength of the light may preferably be 50-1000 nm, particularly 500-900 nm, in the case where the photosensitive silver salt layer 5 contains a sensitizing dye, and 300-500 nm in the case of using no sensitizing dye.

Also in the polymerization exposure step, it is preferred to effect the exposure at an elevated temperature of the plate blank. The elevated temperature may be given by additional heating or by utilizing the remaining heat applied in the previous thermal development step. The temperature should be selected so as not to cause a redox reaction between the organic silver salt and the reducing agent. The elevated temperature can be different depending on the combination of the organic silver salt and the reducing agent but may generally be at most 120° C., preferably at most 90° C., further preferably 60° C. or below.

Figure 9:
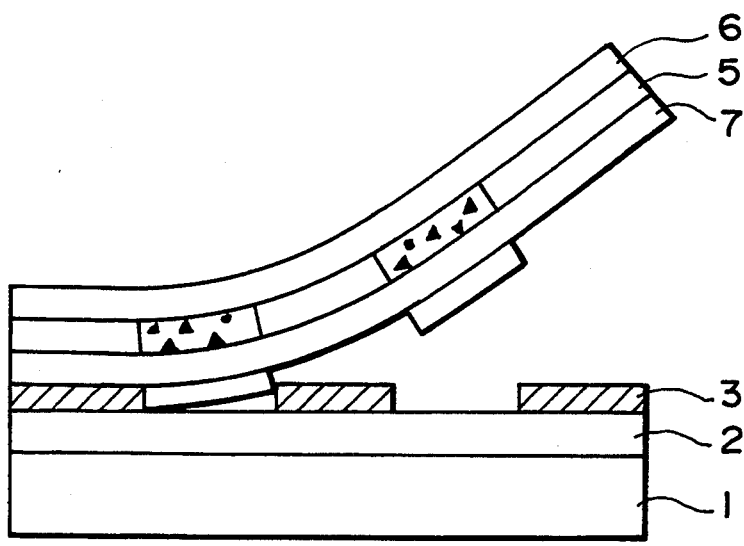

The thus-treated plate blank having a latent image is then subjected to a peeling development step wherein the intermediate layer 7 is peeled apart from the base layer 2 as shown in FIG. 9. At this time, the yet unpolymerized part 3-b of the photosensitive layer 3 is attached to and removed together with the intermediate layer 7, whereby a printing plate having the polymerized part 3-a remaining on the base layer 2 is obtained.

The resultant printing plate in this state can show a preferable printing durability and can be used for printing as it is. It is however preferred to subject the printing plate further to additional exposure, heating and pressurizing similarly as explained with reference to the plate production process using the plate blank of the first embodiment, so as to provide a further improved durability.

The thus-prepared printing plate may be used for printing by using an ink and with or without using dampening water.

The printing plate thus prepared according to the present invention may be applied to a conventional printing apparatus. The printing apparatus may for example be a lithographic printer, suitably a small-scale one, such as a desktop-type or a floor-standing type offset printer, but is not necessarily restricted to the above.

Hereinbelow, an embodiment of a printing apparatus using a printing plate as prepared by the process of the present invention will be described with reference to FIG. 10.

Figure 10:
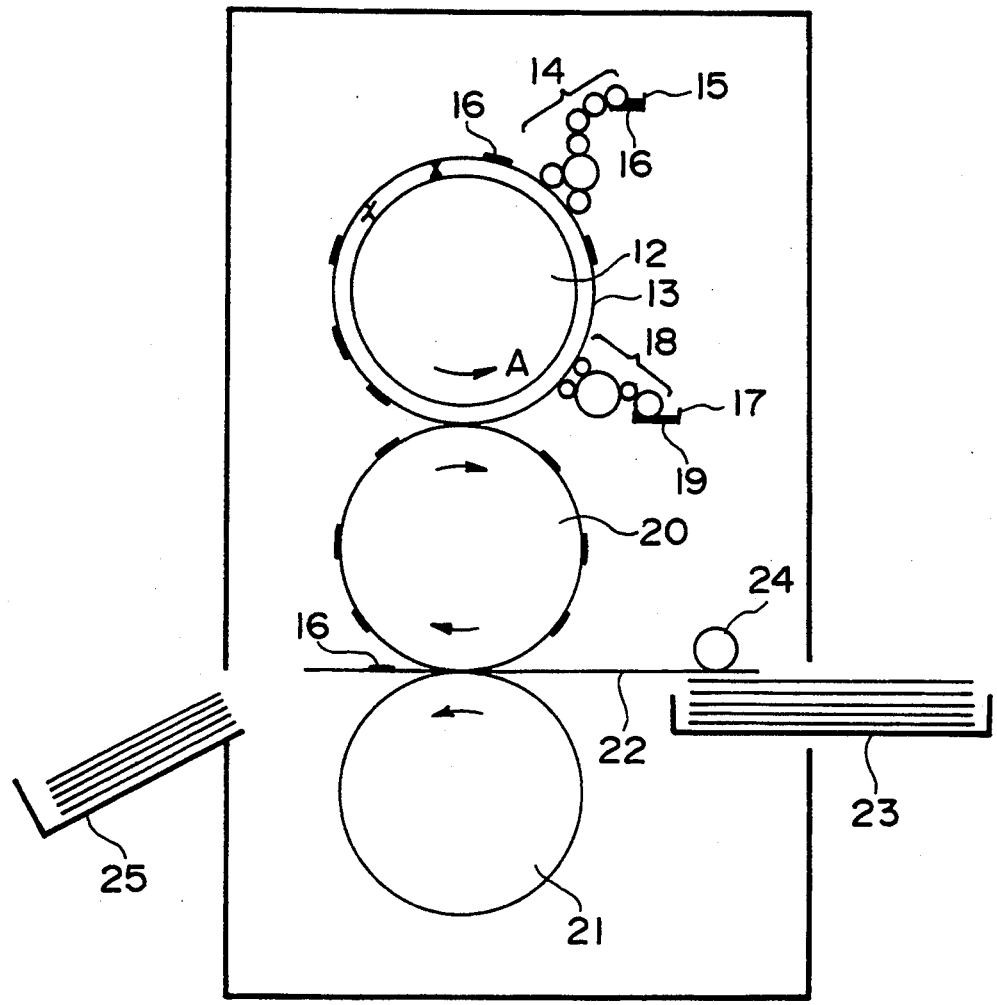
FIG. 10 is a side view of an embodiment of the printing apparatus using a printing plate produced by the process according to the invention.

In a printing apparatus as shown in FIG. 10, a printing plate 13 according to the present invention may be fixed about a plate cylinder 12 means of, e.g., a chuck as used in an ordinary offset printer.

The printing plate 13 is supplied with an ink 16 in an ink fountain 15 through an ink supply means, which comprises a plurality of ink supply rollers 14.

In case where an oily ink is used as the ink 16, prior to the supply of the ink 16 to the plate 13, dampening water 17 in a dampening water reservoir 19 is supplied to the plate 13 through a plurality of rollers 18 along with the rotation of the cylinder 12 in the direction of an arrow A. Then, the ink 16 is supplied.

As a result, at a non-image part formed by the base layer of the plate 13, the dampening water 17 is retained and the ink 16 is repelled. On the other hand, at an image part formed by the polymerized part of the photosensitive layer of the plate 13, the dampening water is repelled, and the ink 16 is attached.

In contact with the plate 13, a blanket cylinder 20 is disposed so as to rotate in a reverse direction with respect to the plate cylinder 12. A impression cylinder 21 as a transfer means is further disposed in contact with the blanket cylinder 20 so as to rotate in a reverse direction with respect to the blanket cylinder 20. As a result, the ink 16 on the plate 13 is first transferred onto the blanket cylinder 20 and then transferred to a recording medium 22 passing between the blanket cylinder 20 and the impression cylinder 21 to complete the printing.

The recording medium 22 composed of, e.g., a paper or plastic sheet is stored in a cassette 23 and sent out sheet by sheet by means of a roller 24, and the recording sheet after the printing is discharged to a tray 25.

The number of the ink supply rollers 14 is not particularly limited but may be generally about 4–20 depending on the distribution and thickness of the ink. Likewise, the number of the dampening water supply rollers 18 is not particularly limited but may generally be about 2–10.

In some cases, the blanket cylinder 20 can be omitted so that the ink on the plate 13 is directly transferred to the recording medium 22. In view of the durability of the plate 13 and the printing performance on rough paper (paper with a poor smoothness), a so-called offset printing using a blanket cylinder is preferred.

In the embodiment shown in FIG. 10, an ink supply means and a dampening water supply means are separately provided. However, it is also possible to supply the dampening water onto the ink supply rollers 14 so that the ink and the dampening water are simultaneously supplied to the plate 13. This arrangement is advantage for compactization of the apparatus to provide a desktop offset printer.

A rotary printing apparatus has been described above, but the printing plate according to the present invention is also applicable to another-type, such as a flat-bed printing apparatus in which a plate-mounting part (corresponding to the plate cylinder 12 in the embodiment of FIG. 10) is in the form of a flat bed.

In the case of printing as explained with reference to FIG. 10, it is preferred to impart dampening water or an ordinary etch liquid to the easily wettable part of the plate so as to convert the plate into a water-retentive state like the desensitization in the conventional lithography, and then fix the plate about the plate cylinder for printing. However, it is also possible to first fix the plate about the plate cylinder and then convert the plate into a water-retentive state, followed by printing.

In the embodiment shown in FIG. 10, an oily or lipophilic ink is used, but it is also possible use an aqueous or hydrophilic ink. In this case, the aqueous or hydrophilic ink is attached selectively to the easily wettable part of the plate and used for printing.

The printing plate according to the present invention can also be formed as a so-called waterless lithographic plate requiring no dampening water. This is accomplished by forming the base layer 3 as a layer having ink-repellency (i.e., a property of being not attached with an ink). Such an ink-repellent base layer 3 may be formed by using a silicone resin or a fluorine-containing resin as a layer-forming polymeric substance constituting the base layer 3 and a silicone (meth)acrylate or a fluoro(meth)acrylate as a polymerizable compound contained in the base layer 3.

Such a waterless lithographic plate prepared in the manner described above may be applied to a printing apparatus obtained by omitting the dampening water-supply system including the dampening water 17, dampening water-supply rollers 18 and dampening water reservoir 19.

In the printing process according to the present invention, it is possible to use a conventionally used ordinary ink including both an oily ink and an aqueous ink.

Herein, the oily or lipophilic ink is an ink composed of such components as dye or pigment, an oil. The resin, a solvent and a plasticizer. The oil may for example be plant oil, prepared oil and mineral oil the resin may include: natural resin, such as rosin and shellac; and synthetic resins, such as phenol-type resins and ketone-type resins. The solvent may preferably be one which shows an appropriate solving and diluting power with respect to the resin constituting the ink and a desired vaporization speed, and provides the whole ink with necessary viscosity and fluidity. Examples of such inks may include: aliphatic hydrocarbons, such as n-hexane; alicyclic hydrocarbons, such as cyclohexane; aromatic hydrocarbons, such as toluene; esters, such as methyl acetate and ethyl acetate; alcohols, such as methyl alcohol and ethyl alcohol; ketones, such as acetone and methyl ethyl ketone; glycols, such as ethylene glycol, propylene glycol, and dipropylene glycol; glycol ethers; and glycol ether esters. These solvents can be used in mixture depending on the desired properties. The plasticizer may be used so as to provide the dried film of the ink with flexibility, softness and cold resistance, and examples thereof may include: phthalic esters, such as dibutyl phthalate and dioctyl phthalate, esters, such as those of adipic acid and citric acid; chlorinated paraffin, castor oil, epoxy-type plasticizers, and polyester-type plasticizers.

The dyes or pigments, may include inorganic or organic pigments, such as titanium oxide, carbon black, bronze powder, diazo yellow, and phthalocyanine blue. In addition to the dyes or pigments, it is also possible to use powdery coloring developer, such as powder of a binder polymer such as polystyrene in which dyes or pigments or metal powder is dispersed. The above dyes or pigments or powdery coloring developer may desirably have an average particle size of 0.1–20 microns, preferably 1–5 microns.

The aqueous or hydrophilic ink may generally comprise a desired dye or pigment as described above, a water-soluble polymer, such as polyvinyl alcohol, polyvinylpyrrolidone or polyacrylamide, an auxiliary agent, such as a surfactant, and water as a solvent.

As described above, the present invention provides a plate blank having a base layer containing a polymerizable compound, which on polymerization exerts a strong interaction or linkage with the polymerized part of the photosensitive formed thereon to provide a printing plate having a remarkably improved printing durability.

Further, according to the present invention, the printing pattern of the printing plate can be formed by peeling development of the photosensitive, whereby a printing plate having excellent resolution and edge sharpness can be prepared conveniently and quickly through a dry process and can also be provided with a heat-resistance through adjustment of the photosensitive layer composition.

The plate blank according to present invention can include a photosensitive dry silver salt layer containing a photosensitive silver halide and in that case can allow a high speed writing (image formation) including direct drawing with a laser beam for plate production.

Hereinbelow, the present invention will be described more specifically based on Examples and Comparative Examples. In the description below, "wt. parts" are simply described as "parts".

EXAMPLE 1

On one surface of a wood-free paper (substrate) comprising primarily long-fiber pulp, excellent in degree of sizing, moisture-resistance and surface-smoothness and having a basis weight of 140 g/m² (the other surface had been treated with a polyester resin for water-proofing), a solution of the following composition was applied by a wire bar and dried to form a 15 μm-thick base layer.

| | |
|---|---|
| 10%-Aqueous solution of polyvinyl alcohol ("Gosenol NH-18", mfd. by Nihon Gosei Kagaku Kogyo K.K.) | 10 part(s) |
| Colloidal Silica ("Snow Tex-O", mfd. by Nissan Kagaku Kogyo K.K.) | 2.7 part(s) |
| Pentatrierythritol triacrylate ("KAYARAD PET-30", mfd. by Nihon Kayaku K.K.) | 0.4 part(s) |

Separately, a 9 μm-thick polyethylene terephthalate film ("Lumirror T", mfd. by Toray K.K.) was provided as a peeling support layer and coated with a solution of the following composition by a wire bar to four a 2–3 μm-thick photosensitive layer.

| | |
|---|---|
| Chlorinated rubber ("Super Chlone CR-5", mfd. by Sanyo Kokusaku Pulp K.K.) | 5.0 part(s) |
| Oligoester acrylate ("Aronix M-6300", mfd. by Toa Gosei Kagaku Kogyo K.K.) | 3.5 part(s) |
| 2,4-Diethylthioxanthone ("KAYACURE DETX", mfd. by Nihon Kayaku K.K.) | 0.75 part(s) |
| Ethyl 4-dimethylaminobenzoate ("KAYACURE EPA", mfd. by Nihon Kayaku K.K.) | 0.75 part(s) |
| Hydroquinone monomethyl ether | 0.01 part(s) |
| Copper-phthalocyanine pigment | 0.1 part(s) |
| Methyl ethyl ketone | 15 part(s) |
| Toluene | 15 part(s) |

Then, the base layer on the substrate and the photosensitive layer on the peeling support layer were superposed to contact each other and passed through a laminator heated to 50° C. and having a nip pressure of 5 kg-f/cm² to form a plate blank according to the present invention.

Then, a negative image mask was placed on the peeling support layer of the plate blank, and the plate blank was exposed for 20 sec through the mask to light from an ultra-high pressure mercury lamp disposed about 10 cm apart from the plate blank, whereby a polymerization latent image was formed.

Then, the polyethylene terephthalate film as the peeling support layer was peeled apart from the plate blank, whereby the yet-unexposed part of the photosensitive layer was peeled apart in adhesion together with the polyethylene terephthalate film, whereby a printing plate comprising the base layer and the exposed part of the photosensitive layer remaining thereon was prepared.

The printing plate was used for lithographic printing in an apparatus as shown in FIG. 10. Referring to FIG. 10, the printing plate 13 was sufficiently wetted with deionized water and then affixed about a plate cylinder 12 of the apparatus. An ink "BSD New Rubber Black Silver", mfd. by Bunshodo K.K.) was placed in an ink fountain 15, and dampening water (deionized water) was placed in a dampening water reservoir 19, followed by operation of the apparatus. As a result, dampening water was first supplied through dampening water supply rollers 18 to the plate 13, and then the ink was supplied through ink supply rollers 14 to the plate 13, whereby the ink was attached not to the base layer forming a non-image part but to the exposed (polymerized) part of the photosensitive layer forming an image part. The plate 13 was caused to contact a blanket cylinder 20 to transfer the ink to the blanket cylinder 20 and then to plain paper 22 supplied by a roller 24 when the plain paper 22 was passed between the blanket cylinder 20 and an impression cylinder 21. The resultant print products were discharged to a tray 25.

The printing speed at that time was 120 sheets/min.

As a result of printing on 3000 sheets of plain paper in the above described manner, good black printed images were obtained free from ground staining. No remarkable peeling of the image part on the plate was observed while slight peeling was observed at the edge portion to an extent which was practically no problem.

EXAMPLE 2

A printing plate prepared in the same manner as in Example 1 was placed on a hot plate heated to 50° C. and exposed for 120 sec to light from the same light source as used in Example 1. The thus-treated printing plate was used in printing on 3000 sheets in the same manner as in Example 1, whereby good printed images free from ground staining were obtained. After the printing, no peeling of the image part on the plate was observed even at the edge of the image part, thus showing an improved printing durability.

EXAMPLE 3

On one surface of a wood-free paper identical to the one used in Example 1, a solution of the following composition was applied by a wire bar and dried to form a 15 μm-thick base layer.

| | |
|---|---|
| 10%-Aqueous solution of polyvinyl alcohol ("Gosenol NH-18", mfd. by Nihon Gosei Kagaku Kogyo K.K.) | 7.3 part(s) |
| Colloidal Silica ("Snow Tex-O", mfd. by Nissan Kagaku Kogyo K.K.) | 2.7 part(s) |
| 2-Hydroxyethylmethacrylate ("Light Ester HO", mfd. by Kyoeisha Yushi Kagaku Kogyo K.K.) | 4.0 part(s) |

Then, the base layer thus formed on the substrate was superposed with the photosensitive layer on the peeling support layer formed in the same manner as in Example 1 and laminated in the same manner as in Example 1 to form a plate blank.

A printing plate was prepared by using the plate blank otherwise in the same manner as in Example 1 and subjected to printing in the same manner as in Example 1. As a result, good printed images free from ground staining were obtained on 1000 sheets. However, as a result of observation of the plate after printing on 1500 sheets, slight peeling was observed at the edge of the image part but it remained to an extent of practically no problem.

Comparative Example 1

A plate blank was prepared in the same manner as in Example 1 except that the pentaerythritol triacrylate was omitted from the composition for preparing the base layer.

A printing plate was prepared from the plate blank and subjected to printing in the same manner as in Example 1. As a result, the printing plate caused an appreciable peeling at a part of the image part only after 10 sheets of printing and caused peeling of the entire part after 15 sheets of printing, thus failing to provide printed images any further.

EXAMPLE 4

A printing plate prepared in the same manner as in Example 3 was passed through hot rollers (nip pressure: 5 kg-f/cm$^2$) heated to 100° C. The thus-treated printing plate was used in printing in the same manner as in Example 3, whereby good printed images free from ground staining were obtained in 1500 sheets of printing without causing appreciable peeling at the image part of the plate, thus showing an improved printing durability of the plate compared with Example 3. After 2000 sheets of printing, however, partial peeling of the image part was observed to an extent of practically no problem.

EXAMPLE 5

A printing plate was prepared in the same manner as in Example 3 except that the imagewise exposure was performed while the plate blank was heated at 50° C. on a hot plate.

The printing plate thus prepared was subjected to printing in the same manner as in Example 3, whereby good printed images free from ground staining were obtained without causing appreciable peeling at the image part of the plate in 2000 sheets of printing, thus showing a printing durability even better than Example 4.

EXAMPLE 6

A printing plate prepared in the same manner as in Example 5 was further passed through hot rollers (nip pressure: 5 kg-f/cm$^2$) heated to 100° C. The thus-treated printing plate was used in printing in the same manner as in Example 5, whereby good printed images free from ground staining were obtained in 2500 sheets of printing without causing appreciable peeling at the image part of the plate.

EXAMPLE 7

On one surface treated for easy adhesion of 100 μm-thick polyester film ("AC-(D)", mfd. by Panac Kogyo K.K.), a solution of the following composition was applied by a wire bar and dried to form a 15 μm-thick base layer.

| | |
|---|---|
| Copolymer of 26 wt. % of polyacrylonitrile and 74 wt. % of polyoxyalkylene ($CH_2=C(CH_3)CO-(OCH_2CH_2)_{30}OCH_3$) | 4.2 part(s) |
| Water-dispersible acrylic resin ("Acryset EX-15", mfd. by Nihon Shokubai Kagaku Kogyo K.K.) | 33.3 part(s) |
| Surfactant ("Emulgen 909", mfd. by Kao K.K.) | 8.4 part(s) |
| Butyl cellosolve | 12.1 part(s) |
| Deionized water | 42.1 part(s) |
| Trimethylolpropane triacrylate ("KAYACURE TMPTA", mfd. by Nihon Kayaku K.K.) | 0.7 part(s) |

Then, the base layer thus formed on the substrate was superposed with the photosensitive layer on the peeling support layer formed in the same manner as in Example 1 and laminated in the same manner as in Example 1 to form a plate blank.

A printing plate was prepared by using the plate blank otherwise in the same manner as in Example 1 and subjected to printing in the same manner as in Example 1. As a result, good printed images free from ground staining were obtained on 1000 or more sheets.

Comparative Example 2

A plate blank was prepared in the same manner as in Example 7 except that the trimethylolpropane triacrylate was omitted from the composition for preparing the base layer.

A printing plate was prepared from the plate blank and subjected to printing in the same manner as in Example 1. As a result, the printing plate caused peeling of the entire image part, thus failing to provide even 10 sheets of print.

EXAMPLE 8

On one surface of a 6 μm-thick polyethylene terephthalate film ("Lumirror T", mfd. by Toray K.K.) used as an intermediate layer, a solution of the following composition was applied in the same manner as in Example 1 to form a photosensitive layer.

| | |
|---|---|
| Linear saturated polyester resin ("Bylon 200", mfd. by Toyo Boseki K.K.) | 4.5 part(s) |
| Chlorinated polyolefin ("Super Chlone 510", mfd. by Sanyo Kokusaku Pulp K.K.) | 0.5 part(s) |
| Oligoester acrylate ("Aronix M-6300", mfd. by Toa Gosei Kagaku Kogyo K.K.) | 3.5 part(s) |
| 2,4-Diethylthioxanthone ("KAYACURE DETX", mfd. by Nihon Kayaku K.K.) | 0.75 part(s) |
| Ethyl 4-dimethylaminobenzoate ("KAYACURE EPA", mfd. by Nihon Kayaku K.K.) | 0.75 part(s) |
| Hydroquinone monomethyl ether | 0.01 part(s) |
| Copper phthalocyanine pigment | 0.1 part(s) |
| Methyl ethyl ketone | 15 part(s) |
| Toluene | 15 part(s) |

The photosensitive layer thus formed was covered by lamination with a polyethylene terephthalate film coated with silicone for release enhancement ("Lumirror Silicone-Coated", mfd. by Toray K.K.) used as a temporary protective layer.

Separately, the following emulsion composition was prepared.

| | |
|---|---|
| AgBr | 0.9 part(s) |
| Silver behenate | 5.0 part(s) |
| Behenic acid | 4.0 part(s) |
| Phthalazinone | 1.0 part(s) |
| 2-Methyl-4-(3,5-di-tert-butyl-4-hydroxybenzyl)-1-naphthol | 2.6 part(s) |
| Polyvinyl butyral ("Eslec BM-2", mfd. by Sekisui Kagaku Kogyo K.K.) | 10 part(s) |
| Methyl ethyl ketone | 90 part(s) |
| Xylene | 50 part(s) |
| n-Butanol | 30 part(s) |

In a dark room, 0.001 part of a sensitizing dye of the following structural formula in solution in 1.0 part of N,N-dimethylformamide was added to the above emulsion composition, and the resultant mixture was subjected to sufficient dissolution, dispersion and mixing in a pain shaker to form an emulsion for photosensitive silver salt layer.

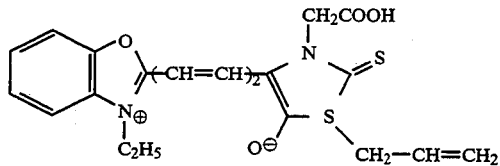

The resultant emulsion was then applied by a wire bar onto a face opposite to the side having the photosensitive layer of the 6 μm-thick polyethylene terephthalate film as the intermediate layer and dried to form a 4-5 μm-thick photosensitive silver salt layer, which was then coated with a 10%-aqueous solution of polyvinyl alcohol ("Gosenol NH-17Q", mfd. by Nihon Gosei Kagaku Kogyo K.K.) by using a wire bar, followed by drying, to form a 2-3 μm-thick protective layer.

Then, the photosensitive layer in the resultant laminate structure was exposed by peeling apart the temporary protective film of silicone-coated polyethylene terephthalate film, superposed with the base layer formed on the substrate of wood-free paper prepared in advance in the same manner as in Example 1, and laminated in the same manner as in Example 1 to form a plate blank according to the present invention.

Then, the plate blank was exposed imagewise from its protective layer side to a scanning He-Ne laser beam (output: 5 mW) by using a drum scan-type laser beam printer (mfd. by Abe Sekkei K.K.), heated at 100° C. for 10 sec, and then exposed for 20 sec with respect to its whole area to light from a fluorescent lamp having a fluorescent peak at 380 nm disposed 10 cm spaced apart, whereby the photosensitive layer was polymerized in a pattern inversely corresponding to the imagewise exposure pattern. Then, the 6 μm-thick polyethylene terephthalate film as the intermediate layer was peeled apart from the base layer on the wood-free paper substrate, whereby the yet unpolymerized part of the photosensitive layer was removed in adhesion with the polyethylene terephthalate film to leave a printing plate retaining the polymerized part of the photosensitive layer remaining on the base layer.

The thus-obtained printing plate was subjected to printing in the same manner as in Example 1, whereby good printed images free from ground staining were obtained without causing peeling of the image part on the plate in 3000 sheets of printing.

EXAMPLE 9

On one surface of a 6 μm-thick polyethylene terephthalate film ("Lumirror T", mfd. by Toray K.K.) used as a peeling support layer, a solution of the following composition was applied in the same manner as in Example 1 to form a photosensitive layer.

| | |
|---|---|
| Linear saturated polyester resin ("Bylon 280", mfd. by Toyo Boseki K.K.) | 4.0 part(s) |
| Chlorinated polyolefin ("Super Chlone 510", mfd. by Sanyo Kokusaku Pulp K.K.) | 1.0 part(s) |
| Oligoester acrylate ("Aronix M-6300", mfd. by Toa Gosei Kagaku Kogyo K.K.) | 3.5 part(s) |
| 2,4-Diethylthioxanthone ("KAYACURE DETX", mfd. by Nihon Kayaku K.K.) | 0.75 part(s) |

-continued

| | |
|---|---|
| Ethyl 4-dimethylaminobenzoate ("KAYACURE EPA", mfd. by Nihon Kayaku K.K.) | 0.75 part(s) |
| Hydroquinone monomethyl ether | 0.01 part(s) |
| Copper phthalocyanine pigment | 0.1 part(s) |
| Methyl ethyl ketone | 10 part(s) |
| Toluene | 10 part(s) |
| Cyclohexanone | 10 part(s) |

Then, the photosensitive layer thus formed on the peeling support layer was superposed with the base layer formed on the substrate prepared in advance in the same manner as in Example 1, and laminated in the same manner as in Example 1 to form a plate blank according to the present invention.

Then, a negative image mask was placed on the peeling support layer of the plate blank, and the plate blank was exposed for 10 sec through the mask to light from an ultra-high pressure mercury lamp disposed about 10 cm apart from the plate blank while the plate blank was simultaneously heated at 85° C. by a hot plate, whereby a polymerization latent image was formed.

Then, the polyethylene terephthalate film as the peeling support layer was peeled apart from the plate blank, whereby the yet-unexposed part of the photosensitive layer was peeled apart in adhesion together with the polyethylene terephthalate film, whereby a printing plate comprising the base layer and the exposed part of the photosensitive layer remaining thereon was prepared.

The thus-prepared printing plate was further subjected to additional exposure and heating in a similar manner as in Example 2 except that the additional exposure was effected for 60 sec while heating the printing plate at 85° C. The printing plate was then further passed through hot rollers in the same manner as in Example 4.

The thus-treated printing plate was subjected to printing in the same manner as in Example 1, whereby good printed images free from ground staining were obtained without causing peeling at the edge of the image part on the plate in 5000 sheets of printing.

What is claimed is:

1. A printing plate blank comprising: a base layer not susceptible of peeling development, a photosensitive layer susceptible of peeling development, and a peeling support layer; wherein said photosensitive layer is a photopolymerizable layer comprising a polymerizable compound, a layer-forming polymer and a photoinitiator, and said base layer comprises a polymerizable compound different from the polymerizable compound contained in the photosensitive layer.

2. A plate blank according to claim 1, wherein said layer-forming polymer comprises a mixture of a chlorinated polyolefin and a linear saturated polyester.

3. A plate blank according to claim 2, wherein 0.1–300 wt. parts of said chlorinated polyolefin is mixed with 100 wt. parts of said linear saturated polyester.

4. A plate blank according to claim 1, wherein said base layer further contains a polymerization initiator.

5. A plate blank according to claim 1, wherein said photosensitive layer shows a contact angle which is larger than that of the base layer.

6. A plate blank according to claim 5, wherein said photosensitive layer shows a contact angle of at least 60 degrees.

7. A plate blank according to claim 5, wherein said base layer shows a contact angle of at most 58 degrees.

8. A printing plate blank comprising, in sequence: a base layer not susceptible of peeling development, a photosensitive layer susceptible of peeling development, and a photosensitive silver salt layer comprising a photosensitive silver halide, an organic silver salt and a reducing agent; wherein said photosensitive layer is a photopolymerizable layer comprising a polymerizable compound, a layer-forming polymer and a photoinitiator, and said base layer comprises a polymerizable compound different from the polymerizable compound contained in the photosensitive layer.

9. A plate blank according to claim 8, wherein said layer-forming polymer comprises a mixture of a chlorinated polyolefin and a linear saturated polyester.

10. A plate blank according to claim 9, wherein 0.1–300 wt. parts of said chlorinated polyolefin is mixed with 100 wt. parts of said linear saturated polyester.

11. A plate blank according to claim 8, wherein said base layer further contains a polymerization initiator.

12. A plate blank according to claim 8, wherein said photosensitive layer shows a contact angle which is larger than that of the base layer.

13. A plate blank according to claim 12, wherein said photosensitive layer shows a contact angle of at least 60 degrees.

14. A plate blank according to claim 12, wherein said base layer shows a contact angle of at most 58 degrees.

15. A plate blank according to claim 8, wherein an intermediate layer is disposed between the photosensitive silver salt layer and the photosensitive layer.

16. A plate blank according to claim 15, wherein said layer-forming polymer comprises a mixture of a chlorinated polyolefin and a linear saturated polyester.

17. A plate blank according to claim 16, wherein 0.1–300 wt. parts of said chlorinated polyolefin is mixed with 100 wt. parts of said linear saturated polyester.

18. A plate blank according to claim 15, wherein said base layer further contains a polymerization initiator.

19. A plate blank according to claim 15, wherein said photosensitive layer shows a contact angle which is larger than that of the base layer.

20. A plate blank according to claim 19, wherein said photosensitive layer shows a contact angle of at least 60 degrees.

21. A plate blank according to claim 18, wherein said base layer shows a contact angle of at most 58 degrees.

22. A process for producing a printing plate comprising:
   an imagewise exposure step of subjecting a plate blank according to claim 1 to imagewise exposure to form a polymerized part and a yet-unpolymerized part within the photosensitive layer; and
   a peeling development step of removing the yet-unpolymerized part of the photosensitive layer by peeling together with the peeling support layer to leave a printing plate comprising the polymerized part of the photosensitive layer on the base layer.

23. A process according to claim 22, wherein the printing plate after the peeling development step is subjected to additional exposure.

24. A process according to claim 22 or 23, wherein the printing plate after the peeling development step is subjected to heating.

25. A process according to claim 22, wherein the printing plate after the peeling development step is subjected to pressure application.

26. A process according to claim 22, wherein the printing plate after the peeling development step is subjected to heating and pressure application.

27. A process according to claim 22, wherein the printing plate after the peeling development step is subjected to additional exposure and first heating, and then to second heating and pressure application.

28. A process for producing a printing plate, comprising:
   an imagewise exposure step of subjecting a plate blank according to claim 8 to imagewise exposure,
   a thermal development step of heating the plate blank,
   a polymerization exposure step of subjecting the plate blank to polymerization exposure to form a polymerized part and a yet-unpolymerized part in the photosensitive layer, and
   a peeling development step of removing the yet-unpolymerized part of the photosensitive layer by peeling together with the photosensitive silver salt layer to leave a printing plate comprising the polymerized part of the photosensitive layer on the base layer.

29. A process according to claim 28, wherein the printing plate after the peeling development step is subjected to additional exposure.

30. A process according to claim 28 or 29, wherein the printing plate after the peeling development step is subjected to heating.

31. A process according to claim 28, wherein the printing plate after the peeling development step is subjected to pressure application.

32. A process according to claim 28, wherein the printing plate after the peeling development step is subjected to heating and pressure application.

33. A process according to claim 28, wherein the printing plate after the peeling development step is subjected to additional exposure and first heating, and then to second heating and pressure application.

34. A printing method, comprising the steps of: supplying an ink to a printing plate produced by a process according to claim 22 or 28, and transferring the ink supplied to the printing plate to a recording medium.

* * * * *

UNITED STATES PATENT AND TRADEMARK OFFICE
CERTIFICATE OF CORRECTION

PATENT NO. : 5,409,798
DATED : April 25, 1995
INVENTOR(S) : YUJI KONDO, ET AL.

It is certified that error appears in the above-identified patent and that said Letters Patent is hereby corrected as shown below:

ON TITLE PAGE

In [56] References Cited, under U.S. PATENT DOCUMENTS:
"Shephard et al." should read --Shepherd et al.--.

In [56] References Cited, under FOREIGN PATENT DOCUMENTS:
"44-18416  8/1967  Japan ." should read
--44-18416  8/1969  Japan .--.

In [57] ABSTRACT: line 10, "port" should read --part--.

COLUMN 6

Line 26, "group containing" should read --group-containing--.

COLUMN 7

Line 53, "reacts" should read --react--.

COLUMN 8

Line 4, "un-polymerized" should read --unpolymerized--.

COLUMN 9

Line 8, "4,4'-(diethylaminobenzophenone," should read
--4,4'-diethylaminobenzophenone,--.

COLUMN 10

Line 36, "poly-a-methylstyrene," should read
--poly-α-methylstyrene,--.

UNITED STATES PATENT AND TRADEMARK OFFICE
CERTIFICATE OF CORRECTION

PATENT NO. : 5,409,798
DATED : April 25, 1995
INVENTOR(S) : YUJI KONDO, ET AL.

It is certified that error appears in the above-identified patent and that said Letters Patent is hereby corrected as shown below:

COLUMN 11

Line 6, "group" (second occurrence) should read --groups--.

COLUMN 12

Line 57, "chlorobromide," should be deleted.
Line 58, "silver iodobromide, and silver" should be deleted.
Line 67, "a-hydrogen," should read --α-hydrogen--.

COLUMN 13

Line 7, "toms" should read --atoms--.

COLUMN 15

Line 4, "groups" should read --group--.
Line 27, "substituted" should read --substituent--.
Line 34, "substituted" should read --substituent--.

COLUMN 16

Line 16, "di-tbutylphenol)" should read --di-t-butylphenol)--.

COLUMN 17

Line 58, "photosensitive 3," should read --photosensitive layer 3,--.
Line 60, "photosensitive layer" should read --photosensitive layer 3--.

UNITED STATES PATENT AND TRADEMARK OFFICE
CERTIFICATE OF CORRECTION

PATENT NO. : 5,409,798
DATED : April 25, 1995
INVENTOR(S) : YUJI KONDO, ET AL.

It is certified that error appears in the above-identified patent and that said Letters Patent is hereby corrected as shown below:

COLUMN 18

Line 60, "pressure." should read --pressure--.

COLUMN 19

Line 10, "polymerized 3-a" should read --polymerized part 3-a--.
Line 57, "(h$\sqrt{}_1$)" should read --(hv1)--.

COLUMN 20

Line 9, "product 12." should read --product 11.--.
Line 23, "(h$\sqrt{}$2)" should read --(hv2)--.
Line 26, "photosensitive 3" should read --photosensitive layer 3--.
Line 42, "lamp," should read --lamps,--.

COLUMN 21

Line 42, "means" should read --by means--.
Line 61, "A" should read --An--.

COLUMN 22

Line 23, "advantage" should read --advantageous-- and "compactization" should read --compacting--.
Line 27, "another-type," should read --another type,--.
Line 41, "use" should read --to use--.
Line 66, "oil. The" should read --oil, a--.
Line 68, "oil the" should read --oil. The--.

UNITED STATES PATENT AND TRADEMARK OFFICE
CERTIFICATE OF CORRECTION

PATENT NO. : 5,409,798
DATED : April 25, 1995
INVENTOR(S) : YUJI KONDO, ET AL.

It is certified that error appears in the above-identified patent and that said Letters Patent is hereby corrected as shown below:

COLUMN 23

Line 24, "pigments," should read --pigments--.

COLUMN 24

Line 18, "four" should read --form--.
Line 61, ""BSD" should read --("BSD--.

COLUMN 28

Line 1, "pain" should read --paint--.

COLUMN 30

Line 47, "claim 18," should read --claim 19,--.

Signed and Sealed this

Tenth Day of October, 1995

Attest:

BRUCE LEHMAN

Attesting Officer

Commissioner of Patents and Trademarks